(12) United States Patent
Ueda et al.

(10) Patent No.: US 6,455,436 B1
(45) Date of Patent: Sep. 24, 2002

(54) METHOD OF FABRICATING SEMICONDUCTOR DEVICE

(75) Inventors: Tetsuya Ueda, Osaka; Eiji Tamaoka; Nobuo Aoi, both of Hyogo, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/479,243

(22) Filed: Jan. 7, 2000

(30) Foreign Application Priority Data

Jan. 8, 1999 (JP) .......................................... 11-002536

(51) Int. Cl.$^7$ ............................................ H01L 21/302
(52) U.S. Cl. ........................ 438/706; 438/710; 438/712
(58) Field of Search .................................. 438/706, 710, 438/712, 623, 627, 629, 633, 638; 257/211, 750, 758

(56) References Cited

U.S. PATENT DOCUMENTS 5,920,790 A  *  7/1999  Wetzel et al. ................ 438/618
5,930,668 A  *  7/1999  Gardner ........................ 438/624
5,937,324 A  *  8/1999  Abercrombie et al. ....... 438/648
6,027,995 A  *  2/2000  Chiang et al. ................ 438/623
6,162,587 A  * 12/2000  Yang et al. ................... 430/314

* cited by examiner

Primary Examiner—Benjamin L. Utech
Assistant Examiner—Lan Vinh
(74) Attorney, Agent, or Firm—Nixon Peabody LLP; Donald R. Studebaker

(57) ABSTRACT

After successively depositing a first metal film and a first silicon oxide film on an insulating film formed on a semiconductor substrate, etching is carried out by using a first resist pattern as a mask, so as to form a first interlayer insulating film having openings from the first silicon oxide film and first metal interconnects from the first metal film. A third interlayer insulating film of an organic film is filled in the openings of the first interlayer insulating film, and the first interlayer insulating film is etched by using a hard mask. A second metal film is then filled in a space in the second interlayer insulating film, so as to form second metal interconnects.

5 Claims, 35 Drawing Sheets

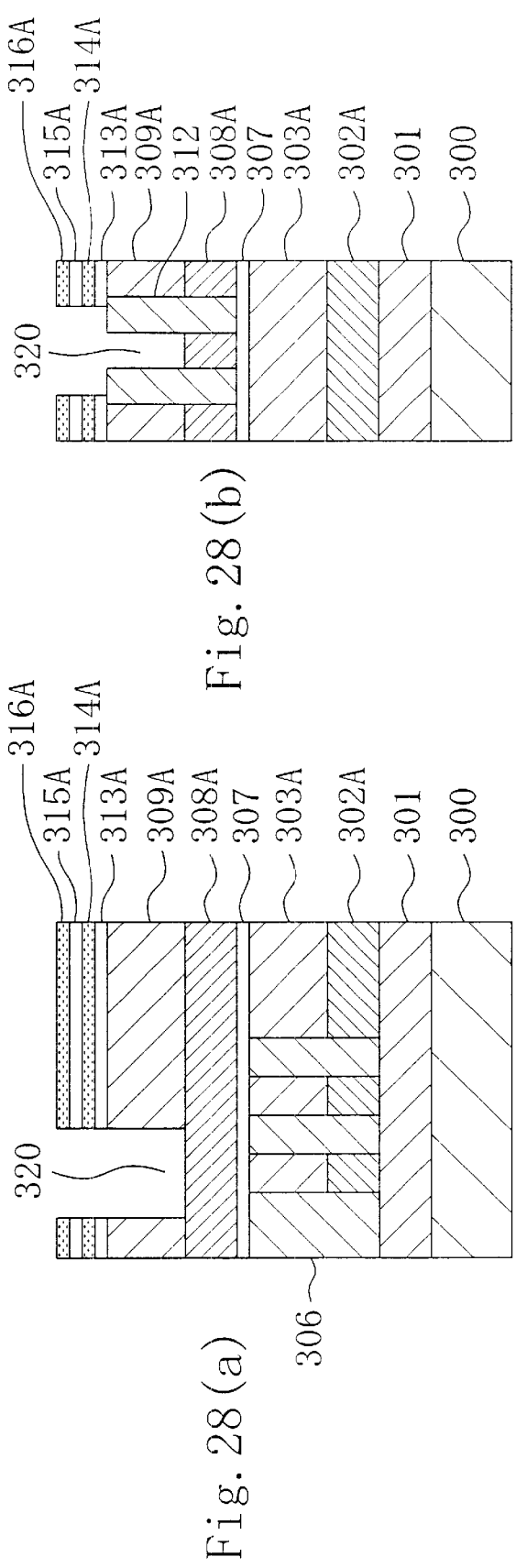
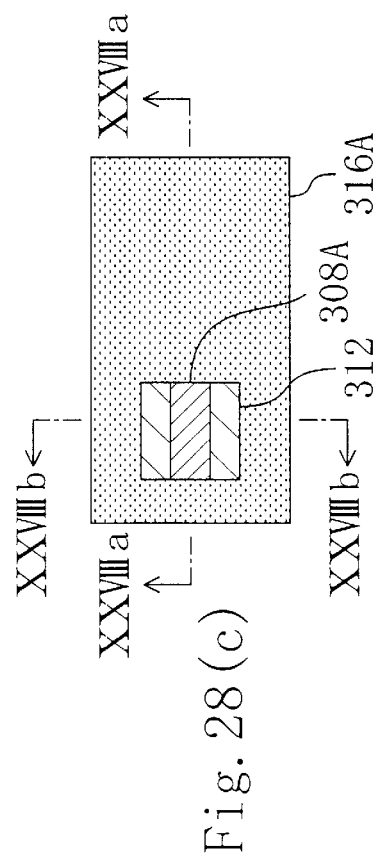
Fig. 28 (a)
Fig. 28 (b)
Fig. 28 (c)

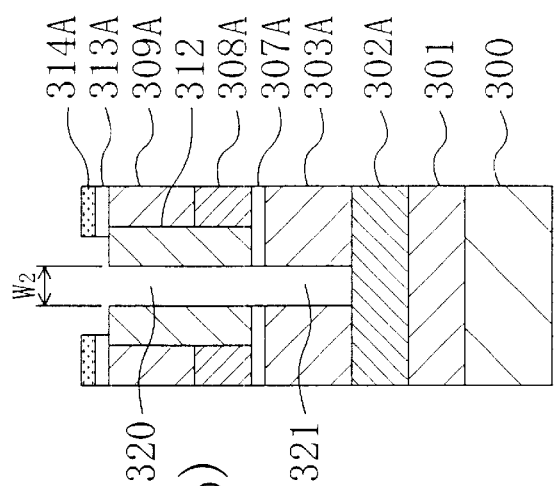
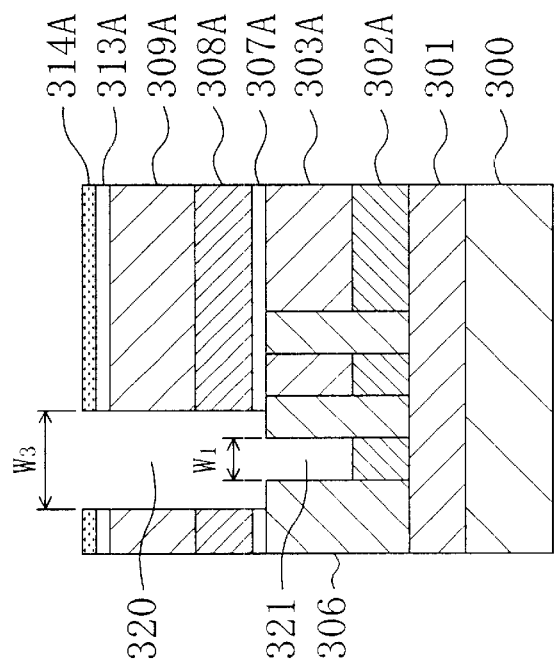
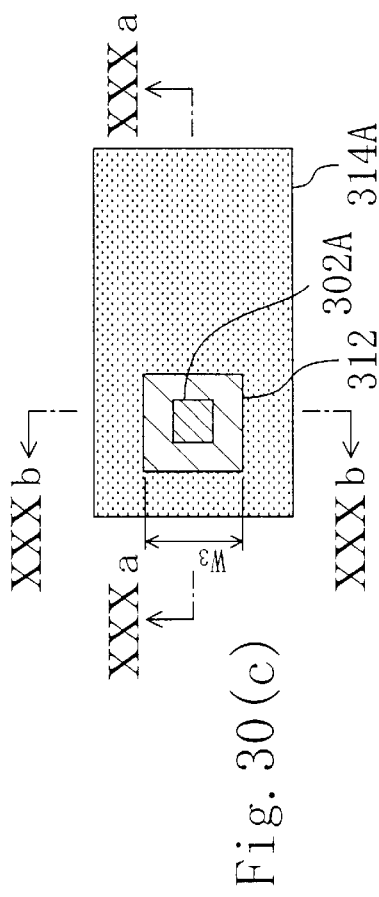

METHOD OF FABRICATING SEMICONDUCTOR DEVICE

BACKGROUND OF THE INVENTION

The present invention relates to a method of fabricating a semiconductor device having multilayer interconnects.

Recently remarkably developed semiconductor process techniques have enabled super refinement and high integration of interconnects and semiconductor devices, and hence, ULSIs have been largely improved in their performance.

In accordance with improvement in the integration of interconnects, however, the operation speed of a device has become restricted by delay of a signal on an interconnect.

Accordingly, in a ULSI of the 0.25 μm generation or later, $SiO_2$ (with a dielectric constant ∈ of 4.3) conventionally used as a material for an interlayer insulating film is to be replaced with another material with a smaller dielectric constant, such as SiOF doped with fluorine (∈=3.5) and SiO:C including an organic substance (∈=2.8 through 3.2) (hereinafter referred to as organic SOG).

Now, a method of fabricating a semiconductor device in which the dielectric constant between interconnects is reduced by using organic SOG disclosed in Japanese Laid-Open Patent Publication No. 9-82799 will be described with reference to FIGS. 34(a) through 34(e).

First, as is shown in FIG. 34(a), an aluminum alloy film with a thickness of 500 nm is deposited on a semiconductor substrate 10, and a first SiOF film (including 6 atom % of fluorine and having a dielectric constant of 3) with a thickness of 200 nm is then deposited on the aluminum alloy film by plasma enhanced CVD. Next, the first SiOF film is patterned into a mask pattern 12 by using a resist pattern as a mask, the resist pattern is then removed, and the aluminum alloy film is patterned into lower-layer interconnects 11 (with a minimum line spacing of 300 nm) by using the mask pattern 12.

Then, as is shown in FIG. 34(b), a second SiOF film 13 (including 6 atom % of fluorine and having a dielectric constant of 3) with a thickness of 100 nm is deposited on the entire surface of the semiconductor substrate 10 by the plasma enhanced CVD. An organic SOG film 14 (having a dielectric constant of 3) with a thickness of 750 nm is then deposited on the second SiOF film 13, and the organic SOG film 14 is locally flattened.

Next, as is shown in FIG. 34(c), the organic SOG film 14 is entirely flattened by CMP using an abrasive of pH 9 including dispersed noncrystal cerium oxide, thereby forming a first interlayer insulating film 14A. In this case, the CMP is carried out until a portion of the organic SOG film 14 above the lower-layer interconnects 11 is removed, but the lower-layer interconnects 11 are never exposed because the second SiOF film 13 works as an etching stopper.

Then, as is shown in FIG. 34(d), a second interlayer insulating film 15 of a silicon oxide film is deposited on the entire surface of the semiconductor substrate 10 by the plasma enhanced CVD.

Thereafter, as is shown in FIG. 34(e), via holes 15a are formed in the second interlayer insulating film 15, and upper-layer interconnects 16 connected to the lower-layer interconnects 11 through the via holes 15a are formed on the second interlayer insulating film 15.

In a semiconductor device fabricated as described above, parasitic capacity between the lower-layer interconnects 11 having the minimum line spacing therebetween is measured, resulting in finding that the dielectric constant is 3 and that the parasitic capacity is small.

The conventional method of fabricating a semiconductor device has, however, the following problems when the line width of the lower-layer interconnect 11 is designed to be the same as the dimension of the via hole 15a and alignment shift is caused in the photolithography for forming the via holes 15a:

FIG. 35 shows the structure of a via hole 17 formed when the alignment shift is caused. When the alignment is shifted, a portion to be etched is shifted from the upper face of the lower-layer interconnect 11 and the etching proceeds to the second SiOF film 13 and the first interlayer insulating film 14A. Therefore, not only the contact area between the via hole 17 and the lower-layer interconnect 11 is reduced but also the aspect ratio of the via hole 17 is increased. When the aspect ratio of the via hole 17 is increased, a cavity is formed in the upper-layer interconnect 16 during the formation thereof (see FIG. 34(e)), and a gas is generated from the organic SOG film used for forming the first interlayer insulating film 14A. As a result, a via contact defect can be disadvantageously caused.

SUMMARY OF THE INVENTION

In consideration of the aforementioned conventional problems, an object of the invention is, in a method of fabricating a semiconductor device designed to have a width of a metal interconnect the same as a dimension of a via hole connected to the upper face of the metal interconnect, preventing position shift of a via contact against the metal interconnect even when alignment shift is caused in a mask pattern used for forming the via hole.

In order to achieve the object, the first method of fabricating a semiconductor device of this invention comprises the steps of successively depositing a first metal film and a first interlayer insulating film on an insulating film formed on a semiconductor substrate; forming a first mask pattern for masking first metal interconnect forming areas on the first interlayer insulating film, and etching the first interlayer insulating film and the first metal film by using the first mask pattern, whereby forming openings in the first interlayer insulating film and forming first metal interconnects from the first metal film; filling a second interlayer insulating film made from a different material from the first interlayer insulating film in the openings of the first interlayer insulating film; forming a second mask pattern having via openings corresponding to via hole forming areas on the first interlayer insulating film and the second interlayer insulating film; etching the first interlayer insulating film by using the second mask pattern under etching conditions that an etching rate for the first interlayer insulating film is higher than an etching rate for the second interlayer insulating film, whereby forming via holes for exposing the first metal interconnects in the second interlayer insulating film; depositing a second metal film on the first interlayer insulating film and the second interlayer insulating film so as to fill the via holes; depositing a third interlayer insulating film on the second metal film; forming a third mask pattern for masking second metal interconnect forming areas on the third interlayer insulating film, and etching the second interlayer insulating film and the second metal film by using the third mask pattern, whereby forming openings in the third interlayer insulating film and forming second metal interconnects from the second metal film; and filling a fourth interlayer insulating film in an interval in the second metal interconnects and in the openings of the third interlayer insulating film.

In the first method of fabricating a semiconductor device, the first interlayer insulating film and the first metal film are etched by using the first mask pattern, so as to form the openings in the first interlayer insulating film and form the first metal interconnects from the first metal film. Therefore, the width of the opening of the first interlayer insulating film accords with the line width of the first metal interconnect. Accordingly, the space in the second interlayer insulating film filled in the openings of the first interlayer insulating film accords with the line width of the first metal interconnect.

Therefore, when the via holes are formed in the second interlayer insulating film by etching the first interlayer insulating film by using the second mask pattern having the via openings under etching conditions that the etching rate for the first interlayer insulating film is higher than the etching rate for the second interlayer insulating film, the dimension of each via hole in the perpendicular direction to the interconnect is smaller than both the dimension of the via opening of the second mask pattern and the line width of the first metal interconnect. Accordingly, in the design where the line width of the first metal interconnect and the dimension of the via hole are the same, the via contact is never shifted from the first metal interconnect even when the alignment shift is caused in the second mask pattern.

In this manner, the increase of the aspect ratio of the via hole can be suppressed in the first method of fabricating a semiconductor device, and hence, no cavity is formed in the via contact. As a result, a contact defect can be prevented from being caused in the via contact.

In the first method of fabricating a semiconductor device, the first interlayer insulating film is preferably made from a material including an inorganic component as a main component, and the second interlayer insulating film is preferably made from a material including an organic component as a main component.

In this manner, the interlayer insulating film including an organic component as a main component and having a small dielectric constant is disposed in the interval in the first metal interconnects, resulting in reducing the capacity between the first metal interconnects. Furthermore, the interlayer insulating film including an inorganic component as a main component and having a good heat conducting property is disposed between the first metal interconnect and the second metal interconnect, resulting in improving a heat releasing property in the first and second metal interconnects. Thus, the etching conditions that the etching rate for the first interlayer insulating film is higher than the etching rate for the second interlayer insulating film can be easily set.

In the first method of fabricating a semiconductor device, the second interlayer insulating film preferably has a smaller dielectric constant than the first interlayer insulating film.

In this manner, the interlayer insulating film having a small dielectric constant is disposed in the interval in the first metal interconnects, resulting in reducing the capacity between the first metal interconnects.

In the first method of fabricating a semiconductor device, the second mask pattern is preferably a hard mask made from a metal material.

In this manner, it is easy to provide the second mask pattern with etching selectivity against the first interlayer insulating film and the second interlayer insulating film. Therefore, the etching conditions that the etching rate for the first interlayer insulating film is higher than the etching rate for the second interlayer insulating film can be easily set.

In the first method of fabricating a semiconductor device, each of the via openings is preferably in a larger plan shape than each of the via holes.

In this manner, even when the alignment shift is caused in the second mask pattern, the dimension of each via contact can be prevented from being smaller than the line width of the first metal interconnect.

The second method of fabricating a semiconductor device of this invention comprises the steps of successively depositing, a first metal film and a first interlayer insulating film on an insulating film formed on a semiconductor substrate; forming a first mask pattern for masking first metal interconnect forming areas on the first interlayer insulating film, and etching the first interlayer insulating film and the first metal film by using the first mask pattern, whereby forming openings in the first interlayer insulating film and forming first metal interconnects from the first metal film; filling a second interlayer insulating film made from a different material from the first interlayer insulating film in an interval in the first metal interconnects and in the openings of the first interlayer insulating film; depositing a sacrifice film of an insulating material on the first interlayer insulating film and the second interlayer insulating film; forming a second mask pattern for masking second metal interconnect forming areas on the sacrifice film, and etching the sacrifice film by using the second mask pattern, whereby forming interconnect patterns from the sacrifice film; filling a third interlayer insulating film in an interval in the interconnect patterns; forming a third mask pattern having via openings corresponding to via hole forming areas on the interconnect patterns and the third interlayer insulating film, and etching the interconnect patterns and the first interlayer insulating film by using the third mask pattern under etching conditions that an etching rate for the interconnect patterns is higher than an etching rate for the third interlayer insulating film and that an etching rate for the first interlayer insulating film is higher than an etching rate for the second interlayer insulating film, whereby forming via holes for exposing the first metal interconnects in the second interlayer insulating film; forming interconnect openings in the third interlayer insulating film by removing the interconnect patterns; and filling a second metal film in the via holes of the second interlayer insulating film and in the interconnect openings of the third interlayer insulating film, whereby simultaneously forming via contacts and second metal interconnects from the second metal film.

In the second method of fabricating a semiconductor device, the first interlayer insulating film and the first metal film are etched by using the first mask pattern, so as to form the openings in the first interlayer insulating film and form the first metal interconnects from the first metal film. Therefore, the width of the opening of the first interlayer insulating film accords with the line width of the first metal interconnect, and hence, the space in the second interlayer insulating film filled in the openings of the first interlayer insulating film accords with the line width of the first metal interconnect.

Accordingly, when the via holes are formed in the second interlayer insulating film by etching the first interlayer insulating film by using the third mask pattern having the via openings under etching conditions that the etching rate for the first interlayer insulating film is higher than the etching rate for the second interlayer insulating film, the dimension of each via hole in the perpendicular direction to the interconnect is smaller than both the dimension of the via opening of the third mask pattern and the line width of the first metal interconnect. Accordingly, in the design in which the line width of the first metal interconnect is the same as the dimension of the via hole, the via contact can be prevented from shifting from the first metal interconnect even when the alignment shift is caused in the second mask pattern. Thus, the increase of the aspect ratio of the via hole can be suppressed, resulting in preventing occurrence of a via contact defect.

Furthermore, after forming the interconnect patterns by etching the sacrifice film by using the second mask pattern for masking the second metal interconnect forming area, the third interlayer insulating film is filled in the interval in the interconnect patterns. Therefore, the space in the third interlayer insulating film accords with the width of the second metal interconnect forming area, and hence, the width of each interconnect opening formed in the third interlayer insulating film naturally accords with the width of the second metal interconnect forming area. Accordingly, the second metal interconnects are obtained by filling the second metal film in the interconnect openings of the third interlayer insulating film. Thus, buried interconnects having a dual damascene structure in which each via contact is never shifted from the first metal interconnect can be formed in a self-alignment manner.

In the second method of fabricating a semiconductor device, the first interlayer insulating film is preferably made from a material including an inorganic component as a main component, and each of the second interlayer insulating film and the third interlayer insulating film is preferably made from a material including an organic component as a main component.

In this manner, the interlayer insulating films both including organic components as main components and having small dielectric constants are respectively disposed between the first metal interconnects and between the second metal interconnects, resulting in reducing the capacity between the first metal interconnects and between the second metal interconnects. Also, the interlayer insulating film including an inorganic component as a main component and having a good heat conducting property is disposed between the first metal interconnect and the second metal interconnect, resulting in improving the heat releasing property in the first and second metal interconnects. Furthermore, the etching conditions that the etching rate for the first interlayer insulating film is higher than the etching rate for the second interlayer insulating film can be easily set.

In the second method of fabricating a semiconductor device, the second interlayer insulating film and the third interlayer insulating film preferably have smaller dielectric constants than the first interlayer insulating film.

In this manner, the interlayer insulating films having small dielectric constants are respectively disposed between the first metal interconnects and between the second metal interconnects, resulting in reducing the capacity between the first metal interconnects and between the second metal interconnects.

In the second method of fabricating a semiconductor device, the third mask pattern is preferably a hard mask made from a metal material.

When the third mask pattern is thus a hard mask made from a metal material, it is easy to provide the third mask pattern with the etching selectivity against the first interlayer insulating film and the second interlayer insulating film. Therefore, the etching conditions that the etching rate for the first interlayer insulating film is higher than the etching rate for the second interlayer insulating film can be easily set.

In the second method of fabricating a semiconductor device, each of the via openings is preferably in a larger plan shape than each of the via holes.

In this manner, even when the alignment shift is caused in the third mask pattern, the dimension of each via contact can be prevented from being smaller than the line width of the first metal interconnect.

The third method of fabricating a semiconductor device of this invention comprises the steps of successively depositing a first metal film and a first interlayer insulating film on an insulating film formed on a semiconductor substrate; forming a first mask pattern for masking first metal interconnect forming areas on the first interlayer insulating film, and etching the first interlayer insulating film and the first metal film by using the first mask pattern, whereby forming openings in the first interlayer insulating film and forming first metal interconnects from the first metal film; filling a second interlayer insulating film made from a different material from the first interlayer insulating film in an interval in the first metal interconnects and in the openings of the first interlayer insulating film; successively depositing a second metal film and a third interlayer insulating film on the first interlayer insulating film and the second interlayer insulating film; forming a second mask pattern for masking second metal interconnect forming areas on the third interlayer insulating film, and etching the third interlayer insulating film and the second metal film by using the second mask pattern, whereby forming openings in the third interlayer insulating film and forming second metal interconnects from the second metal film; filling a fourth interlayer insulating film in an interval in the second metal interconnects and in the openings of the third interlayer insulating film; forming a third mask pattern having via openings corresponding to via hole forming areas on the third interlayer insulating film and the fourth interlayer insulating film; etching the third interlayer insulating film by using the third mask pattern under etching conditions that an etching rate for the third interlayer insulating film is higher than an etching rate for the fourth interlayer insulating film, whereby forming via openings in the fourth interlayer insulating film; etching the second metal interconnects by using the third mask pattern, whereby forming via openings in the second metal interconnects; etching the first interlayer insulating film by using the third mask pattern under etching conditions that an etching rate for the first interlayer insulating film is higher than an etching rate for the second interlayer insulating film, whereby forming via holes for exposing the first metal interconnects in the second interlayer insulating film; filling a third metal film in the via holes of the second interlayer insulating film and in the via openings of the second metal interconnect, whereby forming via contacts from the third metal film and connecting the via contacts to the second metal interconnects through the third metal film; and filling a burying insulating film in the via openings of the fourth interlayer insulating film.

In the third method of fabricating a semiconductor device, the first interlayer insulating film and the first metal film are etched by using the first mask pattern, so as to form the openings in the first interlayer insulating film and form the first metal interconnects from the first metal film. Therefore, the width of the opening of the first interlayer insulating film accords with the line width of the first metal interconnect, and hence, the space in the second interlayer insulating film filled in the openings of the first interlayer insulating film accords with the line width of the first metal interconnect.

Accordingly, when the via holes are formed in the second interlayer insulating film by etching the first interlayer insulating film by using the third mask pattern having the via openings under etching conditions that the etching rate for the first interlayer insulating film is higher than the etching rate for the second interlayer insulating film, the dimension of each via hole in the perpendicular direction to the interconnect is smaller than both the dimension of the via opening of the third mask pattern and the line width of the first metal interconnect. Accordingly, in the design in which the line width of the first metal interconnect is the same as the dimension of the via hole, the via contact is never shifted from the first metal interconnect even when the alignment shift is caused in the second mask pattern. Thus, the increase of the aspect ratio of the via hole can be suppressed, resulting in preventing the occurrence of a via contact defect.

Furthermore, after forming the via openings in the second metal interconnects and the via holes in the second interlayer insulating film by using the third mask pattern, the third metal film is filled in the via holes and the via openings, so as to form the contacts and connect the second metal interconnects. Therefore, the via contacts and the second metal interconnects can be simultaneously formed. Thus, buried interconnects having a dual damascene structure in which each via contact is never shifted from the first metal interconnect can be formed in a self-alignment manner, and a semiconductor device having a multilayer interconnect structure including three or more layers can be definitely fabricated by repeating procedures subsequent to the formation of the third mask pattern.

In the third method of fabricating a semiconductor device, the first interlayer insulating film is preferably made from a material including an inorganic component as a main component, and each of the second interlayer insulating film and the fourth interlayer insulating film is preferably made from a material including an organic component as a main component.

In this manner, the interlayer insulating films both including organic components as main components and having small dielectric constants are respectively disposed between the first metal interconnects and between the second metal interconnects, resulting in reducing the capacity between the first metal interconnects and between the second metal interconnects. Also, the interlayer insulating film including an inorganic component as a main component and having a good heat conducting property is disposed between the first metal interconnect and the second metal interconnect, resulting in improving the heat releasing property in the first and second metal interconnects. Furthermore, the etching conditions that the etching rate for the first interlayer insulating film is higher than the etching rate for the second interlayer insulating film can be easily set.

In the third method of fabricating a semiconductor device, the second interlayer insulating film and the fourth interlayer insulating film preferably have smaller dielectric constants than the first interlayer insulating film.

In this manner, the interlayer insulating films having small dielectric constants are respectively disposed between the first metal interconnects and between the second metal interconnects, resulting in reducing the capacity between the first metal interconnects and between the second metal interconnects.

In the third method of fabricating a semiconductor device, the third mask pattern is preferably a hard mask made from a metal material.

In this manner, it is easy to provide the third mask pattern with the etching selectivity against the first interlayer insulating film and the second interlayer insulating film, and hence, the etching conditions that the etching rate for the first interlayer insulating film is higher than the etching rate for the second interlayer insulating film can be easily set.

In the third method of fabricating a semiconductor device, each of the via openings is preferably in a larger plan shape than each of the via holes.

In this manner, even when the alignment shift is caused in the third mask pattern, the dimension of each via contact can be prevented from being smaller than the line width of the first metal interconnect.

BRIEF DESCRIPTION OF THE DRAWINGS

FIGS. 1(a) and 1(b) show a procedure in a method of fabricating a semiconductor device according to Embodiment 1, wherein FIG. 1(a) is a sectional view taken on line Ia—Ia of FIG. 1(b) and FIG. 1(b) is a plan view;

FIGS. 2(a) and 2(b) show a procedure in the method of fabricating a semiconductor device according to Embodiment 1, wherein FIG. 2(a) is a sectional view taken on line IIa—IIa of FIG. 2(b) and FIG. 2(b) is a plan view;

FIGS. 3(a) and 3(b) show a procedure in the method of fabricating a semiconductor device according to Embodiment 1, wherein FIG. 3(a) is a sectional view taken on line IIIa—IIIa of FIG. 3(b) and FIG. 3(b) is a plan view;

FIGS. 4(a) and 4(b) show a procedure in the method of fabricating a semiconductor device according to Embodiment 1, wherein FIG. 4(a) is a sectional view taken on line IVa—IVa of FIG. 4(b) and FIG. 4(b) is a plan view;

FIGS. 5(a) and 5(b) show a procedure in the method of fabricating a semiconductor device according to Embodiment 1, wherein FIG. 5(a) is a sectional view taken on line Va—Va of FIG. 5(b) and FIG. 5(b) is a plan view;

FIGS. 6(a) and 6(b) show a procedure in the method of fabricating a semiconductor device according to Embodiment 1, wherein FIG. 6(a) is a sectional view taken on line VIa—VIa of FIG. 6(b) and FIG. 6(b) is a plan view;

FIGS. 7(a) and 7(b) show a procedure in the method of fabricating a semiconductor device according to Embodiment 1, wherein FIG. 7(a) is a sectional view taken on line VIIa—VIIa of FIG. 7(b) and FIG. 7(b) is a plan view;

FIGS. 8(a) and 8(b) show a procedure in the method of fabricating a semiconductor device according to Embodiment 1, wherein FIG. 8(a) is a sectional view taken on line VIIIa—VIIIa of FIG. 8(b) and FIG. 8(b) is a plan view;

FIGS. 9(a) through 9(c) show a procedure in a method of fabricating a semiconductor device according to Embodiment 2, wherein FIG. 9(a) is a sectional view taken on line IXa—IXa of FIG. 9(c), FIG. 9(b) is a sectional view taken on line IXb—IXb of FIG. 9(c) and FIG. 9(c) is a plan view;

FIGS. 10(a) through 10(c) show a procedure in the method of fabricating a semiconductor device according to Embodiment 2, wherein FIG. 10(a) is a sectional view taken on line Xa—Xa of FIG. 10(c), FIG. 10(b) is a sectional view taken on line Xb—Xb of FIG. 10(c) and FIG. 10(c) is a plan view;

FIGS. 11(a) through 11(c) show a procedure in the method of fabricating a semiconductor device according to Embodiment 2, wherein FIG. 11(a) is a sectional view taken on line XIa—XIa of FIG. 11(c), FIG. 11(b) is a sectional view taken on line XIb—XIb of FIG. 11(c) and FIG. 11(c) is a plan view;

FIGS. 12(a) through 12(c) show a procedure in the method of fabricating a semiconductor device according to Embodiment 2, wherein FIG. 12(a) is a sectional view taken on line XIIa—XIIa of FIG. 12(c), FIG. 12(b) is a sectional view taken on line XIIb—XIIb of FIG. 12(c) and FIG. 12(c) is a plan view;

FIGS. 13(a) through 13(c) show a procedure in the method of fabricating a semiconductor device according to Embodiment 2, wherein FIG. 13(a) is a sectional view taken on line XIIIa—XIIIa of FIG. 13(c), FIG. 13(b) is a sectional view taken on line XIIIb—XIIIb of FIG. 13(c) and FIG. 13(c) is a plan view;

FIGS. 14(a) through 14(c) show a procedure in the method of fabricating a semiconductor device according to Embodiment 2, wherein FIG. 14(a) is a sectional view taken on line XIVa—XIVa of FIG. 14(c), FIG. 14(b) is a sectional view taken on line XIVb—XIVb of FIG. 14(c) and FIG. 14(c) is a plan view;

FIGS. 15(a) through 15(c) show a procedure in the method of fabricating a semiconductor device according to Embodiment 2, wherein FIG. 15(a) is a sectional view taken on line XVa—XVa of FIG. 15(c), FIG. 15(b) is a sectional view taken on line XVb—XVb of FIG. 15(c) and FIG. 15(c) is a plan view;

FIGS. 16(a) through 16(c) show a procedure in the method of fabricating a semiconductor device according to Embodiment 2, wherein FIG. 16(a) is a sectional view taken on line XVIa—XVIa of FIG. 16(c), FIG. 16(b) is a sectional view taken on line XVIb—XVIb of FIG. 16(c) and FIG. 16(c) is a plan view;

FIGS. 17(a) through 17(c) show a procedure in the method of fabricating a semiconductor device according to Embodiment 2, wherein FIG. 17(a) is a sectional view taken on line XVIIa—XVIIa of FIG. 17(c), FIG. 17(b) is a sectional view taken on line XVIIb—XVIIb of FIG. 17(c) and FIG. 17(c) is a plan view;

FIGS. 18(a) through 18(c) show a procedure in the method of fabricating a semiconductor device according to Embodiment 2, wherein FIG. 18(a) is a sectional view taken on line XVIIIa—XVIIIa of FIG. 18(c), FIG. 18(b) is a sectional view taken on line XVIIIb—XVIIIb of FIG. 18(c) and FIG. 18(c) is a plan view;

FIGS. 19(a) through 19(c) show a procedure in the method of fabricating a semiconductor device according to Embodiment 2, wherein FIG. 19(a) is a sectional view taken on line XIXa—XIXa of FIG. 19(c), FIG. 19(b) is a sectional view taken on line XIXb—XIXb of FIG. 19(c) and FIG. 19(c) is a plan view;

FIGS. 20(a) through 20(c) show a procedure in the method of fabricating a semiconductor device according to Embodiment 2, wherein FIG. 20(a) is a sectional view taken on line XXa—XXa of FIG. 20(c), FIG. 20(b) is a sectional view taken on line XXb—XXb of FIG. 20(c) and FIG. 20(c) is a plan view;

FIGS. 21(a) through 21(c) show a procedure in a method of fabricating a semiconductor device according to Embodiment 3, wherein FIG. 21(a) is a sectional view taken on line XXIa—XXIa of FIG. 21(c), FIG. 21(b) is a sectional view taken on line XXIb—XXIb of FIG. 21(c) and FIG. 21(c) is a plan view;

FIGS. 22(a) through 22(c) show a procedure in the method of fabricating a semiconductor device according to Embodiment 3, wherein FIG. 22(a) is a sectional view taken on line XXIIa—XXIIa of FIG. 22(c), FIG. 22(b) is a sectional view taken on line XXIIb—XXIIb of FIG. 22(c) and FIG. 22(c) is a plan view;

FIGS. 23(a) through 23(c) show a procedure in the method of fabricating a semiconductor device according to Embodiment 3, wherein FIG. 23(a) is a sectional view taken on line XXIIIa—XXIIIa of FIG. 23(c), FIG. 23(b) is a sectional view taken on line XXIIIb—XXIIIb of FIG. 23(c) and FIG. 23(c) is a plan view;

FIGS. 24(a) through 24(c) show a procedure in the method of fabricating a semiconductor device according to Embodiment 3, wherein FIG. 24(a) is a sectional view taken on line XXIVa—XXIVa of FIG. 24(c), FIG. 24(b) is a sectional view taken on line XXIVb—XXIVb of FIG. 24(c) and FIG. 24(c) is a plan view;

FIGS. 25(a) through 25(c) show a procedure in the method of fabricating a semiconductor device according to Embodiment 3, wherein FIG. 25(a) is a sectional view taken on line XXVaXXVa of FIG. 25(c), FIG. 25(b) is a sectional view taken on line XXVb—XXVb of FIG. 25(c) and FIG. 25(c) is a plan view;

FIGS. 26(a) through 26(c) show a procedure in the method of fabricating a semiconductor device according to Embodiment 3, wherein FIG. 26(a) is a sectional view taken on line XXVIa—XXVIa of FIG. 26(c), FIG. 26(b) is a sectional view taken on line XXVIb—XXVIb of FIG. 26(c) and FIG. 26(c) is a plan view;

FIGS. 27(a) through 27(c) show a procedure in the method of fabricating a semiconductor device according to Embodiment 3, wherein FIG. 27(a) is a sectional view taken on line XXVIIa—XXVIIa of FIG. 27(c), FIG. 27(b) is a sectional view taken on line XXVIIb—XXVIIb of FIG. 27(c) and FIG. 27(c) is a plan view;

FIGS. 28(a) through 28(c) show a procedure in the method of fabricating a semiconductor device according to Embodiment 3, wherein FIG. 28(a) is a sectional view taken on line XXVIIIa—XXVIIIa of FIG. 28(c), FIG. 28(b) is a sectional view taken on line XXVIIIb—XXVIIIb of FIG. 28(c) and FIG. 28(c) is a plan view;

FIGS. 29(a) through 29(c) show a procedure in the method of fabricating a semiconductor device according to Embodiment 3, wherein FIG. 29(a) is a sectional view taken on line XXIXa—XXIXa of FIG. 29(c), FIG. 29(b) is a sectional view taken on line XXIXb—XXIXb of FIG. 29(c) and FIG. 29(c) is a plan view;

FIGS. 30(a) through 30(c) show a procedure in the method of fabricating a semiconductor device according to Embodiment 3, wherein FIG. 30(a) is a sectional view taken on line XXXa—XXXa of FIG. 30(c), FIG. 30(b) is a sectional view taken on line XXXb—XXXb of FIG. 30(c) and FIG. 30(c) is a plan view;

FIGS. 31(a) through 31(c) show a procedure in the method of fabricating a semiconductor device according to Embodiment 3, wherein FIG. 31(a) is a sectional view taken on line XXXIa—XXXIa of FIG. 31(c), FIG. 31(b) is a sectional view taken on line XXXIb—XXXIb of FIG. 31(c) and FIG. 31(c) is a plan view;

FIGS. 32(a) through 32(c) show a procedure in the method of fabricating a semiconductor device according to Embodiment 3, wherein FIG. 32(a) is a sectional view taken on line XXXIIa—XXXIIa of FIG. 32(c), FIG. 32(b) is a sectional view taken on line XXXIIb—XXXIIb of FIG. 32(c) and FIG. 32(c) is a plan view;

FIGS. 33(a) through 33(c) show a procedure in the method of fabricating a semiconductor device according to Embodiment 3, wherein FIG. 33(a) is a sectional view taken on line XXXIIIa—XXXIIIa of FIG. 33(c), FIG. 33(b) is a sectional view taken on line XXXIIIb—XXXIIIb of FIG. 33(c) and FIG. 33(c) is a plan view;

DETAILED DESCRIPTION OF THE INVENTION

Embodiment 1

Now, a method of fabricating a semiconductor device according to Embodiment 1 of the invention will be described with reference to FIGS. 1(a), 1(b), 2(a), 2(b), 3(a), 3(b), 4(a), 4(b), 5(a), 5(b), 6(a), 6(b), 7(a), 7(b), 8(a) and 8(b).

Figure 1A:
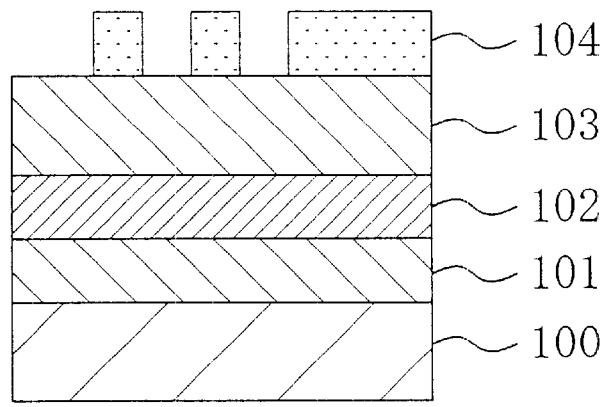
Figure 1B:
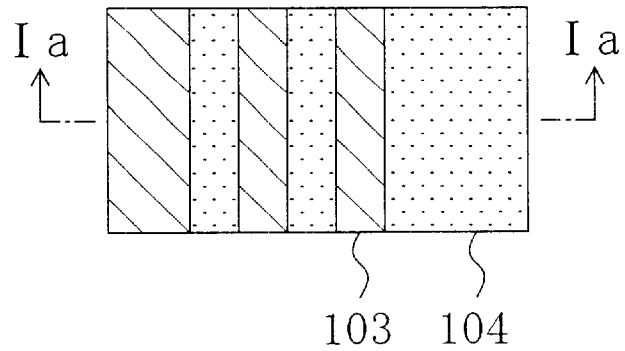
Figure 2A:
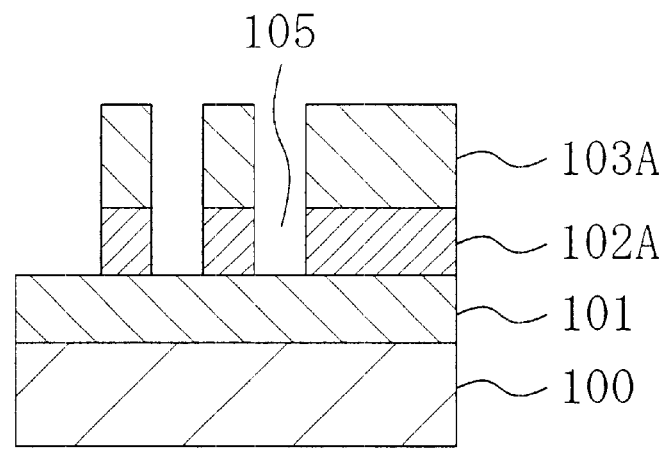
Figure 2B:
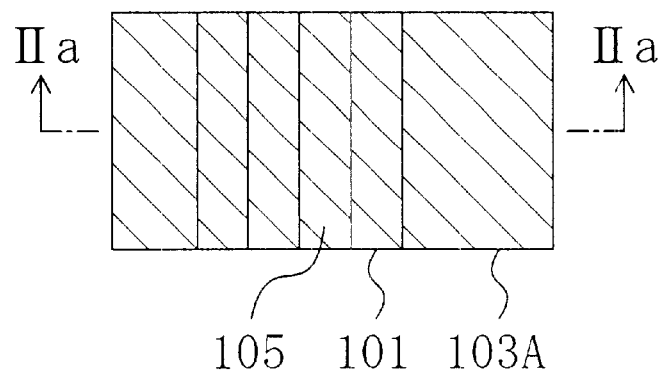

First, as is shown in FIGS. 1(a) and 1(b), an insulating film 101 with a thickness of 2.0 μm is formed on the entire surface of a semiconductor substrate 100 bearing a semiconductor active device not shown. Then, a first metal film 102 with a thickness of 0.5 μm of a multi-layer film including a copper film and a tantalum alloy film such as a TaN film is deposited on the insulating film 101 by sputtering or electroplating. Then, a first silicon oxide film 103 with a thickness of 1.0 μm is deposited on the first metal film 102, and a first resist pattern 104 having openings corresponding to interconnect forming areas of a first layer is formed on the first silicon oxide film 103. Next, as is shown in FIGS. 2(a) and 2(b), the first silicon oxide film 103 is etched by using a CF etching gas at a low temperature with the first resist pattern 104 used as a mask, thereby forming a first interlayer insulating film 103A. Thereafter, the first metal film 102 is etched so as to expose the insulating film 101 by using a Cl etching gas at a high temperature, thereby forming first metal interconnects 102A having a line spacing 105. Then, the first resist pattern 104 is removed.

Figure 3A:
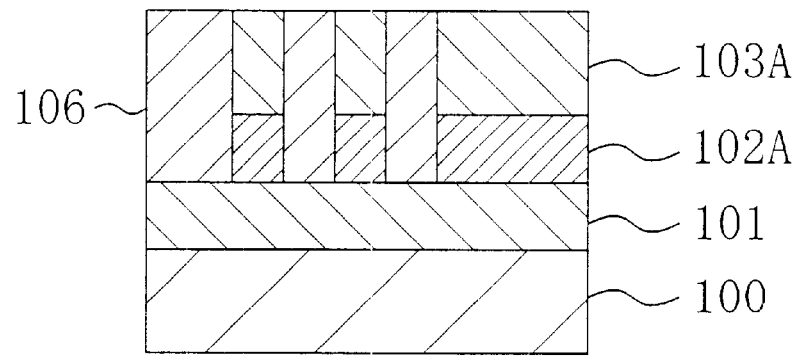
Figure 3B:
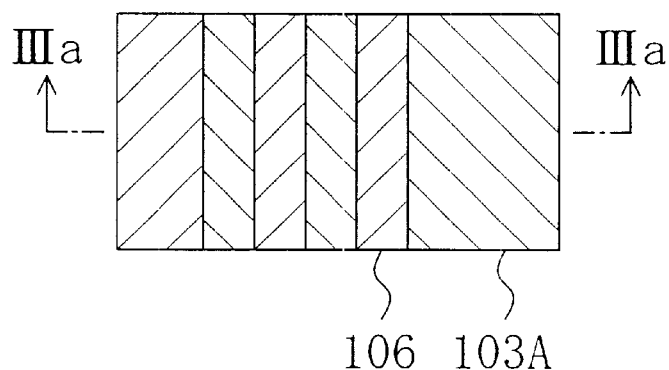

Subsequently, as is shown in FIGS. 3(a) and 3(b), an organic film is deposited on the entire surface of the semiconductor substrate 100 by a spin coater method or plasma enhanced CVD, and a portion of the organic film exposed on the first metal interconnects 102A is removed by CMP. Thus, the line spacing 105 in the first metal interconnects 102A is filled with a second interlayer insulating film 106 of the organic film. An example of the material for the organic film is an organic substance including organic polysiloxane or fluorine. The organic film made from such a material is characterized by a smaller dielectric constant than the first silicon oxide film 103 (first interlayer insulating film 103A) and a lower etching rate against a CF etching gas than the first silicon oxide film 103. Since the second interlayer insulating film 106 has a small dielectric constant, the capacity between the first metal interconnects 102A can be reduced.

Figure 4A:
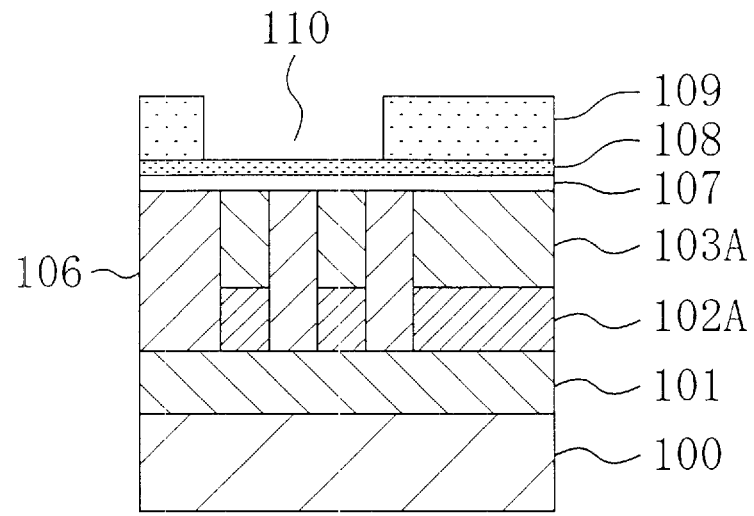
Figure 4B:
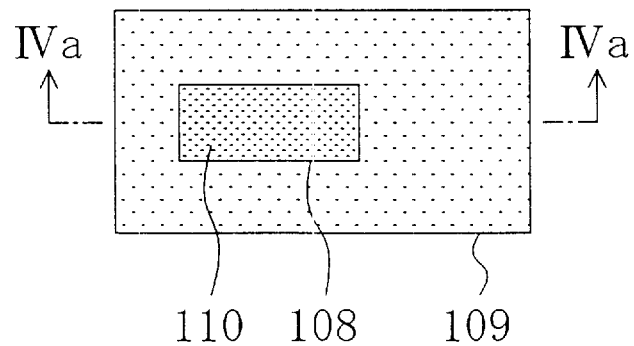

Then, as is shown in FIGS. 4(a) and 4(b), a second silicon oxide film 107 and a titanium nitride film 108 are successively deposited on the entire surface of the semiconductor substrate 100. Thereafter, a second resist pattern 109 having via openings 110 is formed on the titanium nitride film 108 by lithography.

Figure 5A:
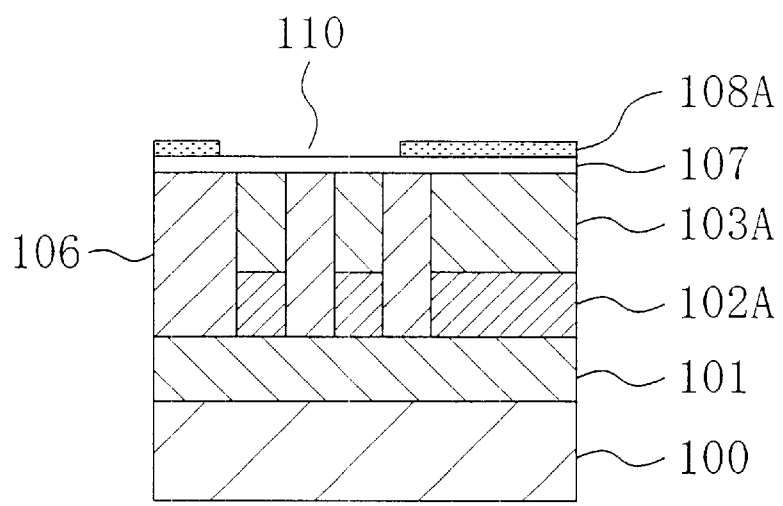
Figure 5B:
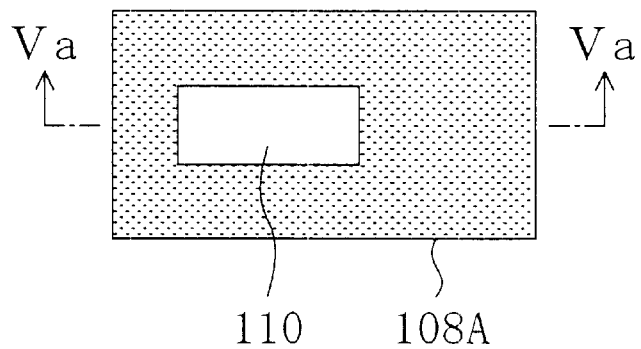

Next, as is shown in FIGS. 5(a) and 5(b), the titanium nitride film 108 is etched by using a Cl etching gas with the second resist pattern 109 used as a mask, thereby transferring the via openings 110 onto the titanium nitride film 108. Thus, a hard mask 108A having the via openings 110 is formed. Then, the second resist pattern 109 is removed.

Figure 6A:
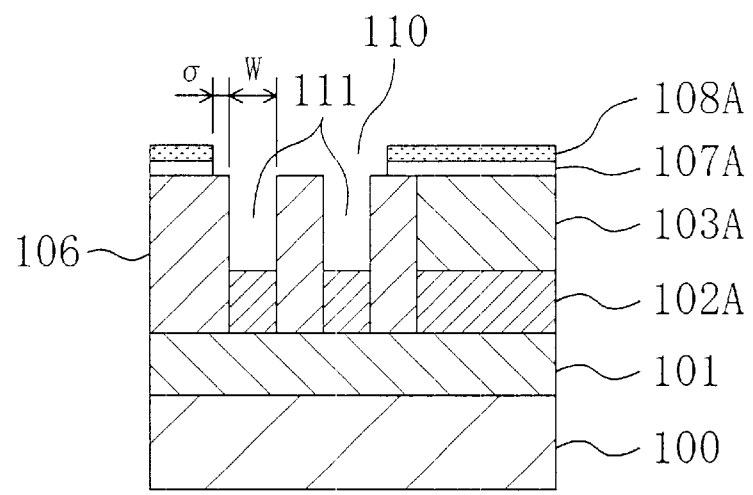
Figure 6B:
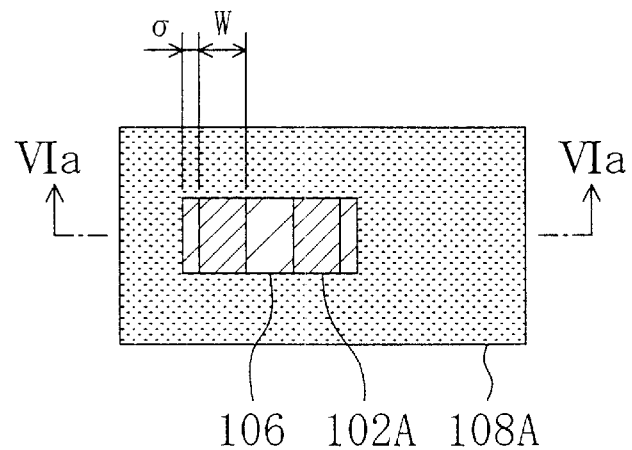

Subsequently, as is shown in FIGS. 6(a) and 6(b), the second silicon oxide film 107 and the first interlayer insulating film 103A are continuously etched by using a CF etching gas with the hard mask 108A used as a mask, thereby forming via holes 111 in the first interlayer insulating film 103A. In this case, since the second interlayer insulating film 106 and the first interlayer insulating film 103A are made from different materials, the second interlayer insulating film 106 is minimally etched by the CF etching gas. Therefore, the via openings 110 can be selectively formed in the second silicon oxide film 107, and the two adjacent via holes 111 can be simultaneously formed in the first interlayer insulating film 103A. In this case, the dimension along line VIa—VIa of each via opening 110 is set to be equal to a sum of line widths W of the two first metal interconnects 102A, the line spacing between the first metal interconnects 102A and clearances δ on both sides. Thus, the via holes 111 can be definitely formed on the first metal interconnects 102A even when alignment shift is caused in the second resist pattern 109 and further in the hard mask 108A, and hence, an exposure margin in the lithography can be increased.

Figure 7A:
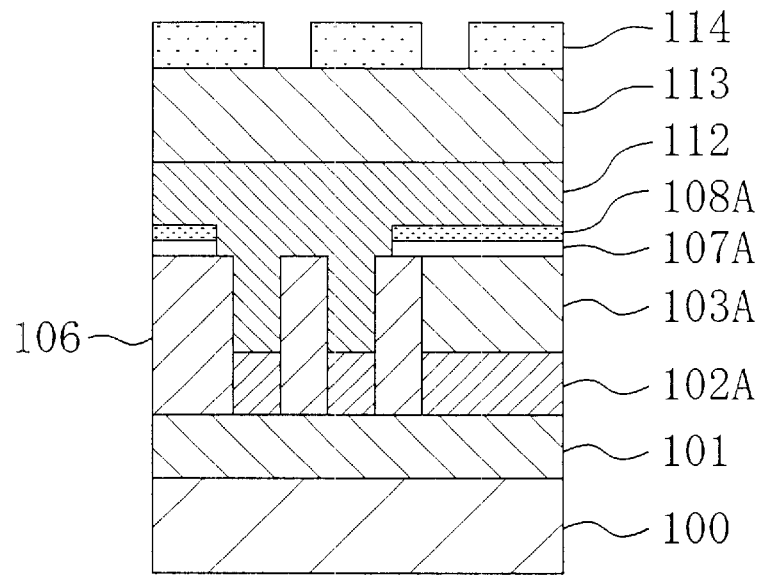
Figure 7B:
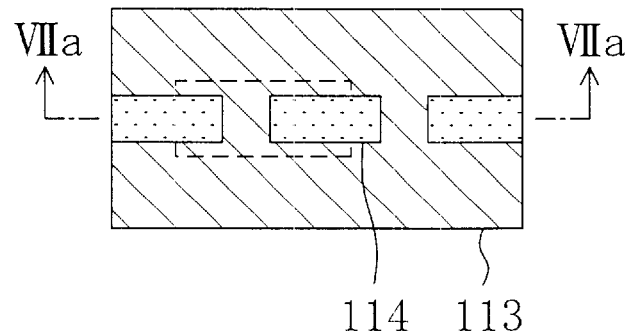

Next, as is shown in FIGS. 7(a) and 7(b), a second metal film 112 with a thickness of 0.5 μm of a multi-layer film including a copper film and a tantalum alloy film such as a TaN film is deposited on the entire surface of the semiconductor substrate 110 by the sputtering or the electroplating so as to fill the via holes 111. Then, a third silicon oxide film 113 with a thickness of 1.0 μm is deposited on the second metal film 112, and a third resist pattern 114 having openings corresponding to interconnect forming areas of a second layer is formed on the third silicon oxide film 113.

Figure 8A:
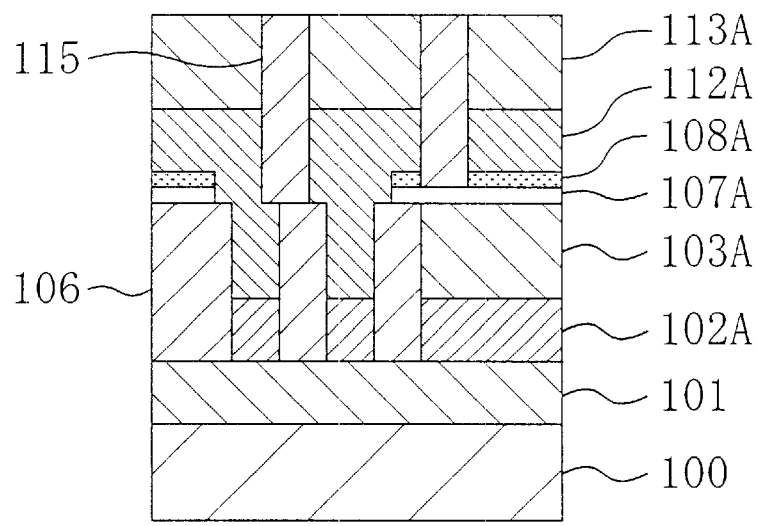
Figure 8B:
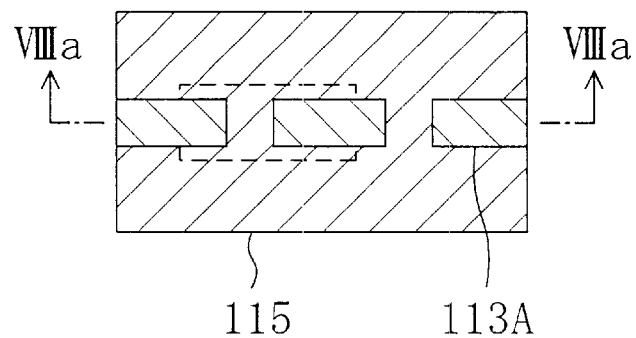

Then, as is shown in FIGS. 8(a) and 8(b), the third silicon oxide film 113 is etched by using a CF etching gas at a low temperature with the third resist pattern 114 used as a mask, thereby forming a third interlayer insulating film 113A having via holes. Thereafter, the second metal film 112 is etched by using a Cl etching gas at a high temperature, thereby forming second metal interconnects 112A. Then, after removing the third resist pattern 114, an organic film made from, for example, an organic substance including organic polysiloxane or fluorine is deposited on the entire surface of the semiconductor substrate 100, and a portion of the organic film exposed on the third interlayer insulating film 113A is removed by the CMP. Thus, a fourth interlayer insulating film 115 is filled in the line spacing in the second metal interconnects 112A and the via holes of the third interlayer insulating film 113A.

The aforementioned procedures can be repeated so as to fabricate a semiconductor device having a multilayer interconnect structure.

According to Embodiment 1, the second interlayer insulating film 106 of the organic film having a smaller dielectric constant than the first interlayer insulating film 103A (first silicon oxide film 103) is filled in the interval in the first metal interconnects 102A, and the fourth interlayer insulating film 115 of the organic film having a smaller dielectric constant than the third interlayer insulating film 113A (third silicon oxide film 113) is filled in the interval in the second metal interconnects 112A. Accordingly, the capacity between the first metal interconnects 102A and between the second metal interconnects 112A can be reduced. Furthermore, since the first interlayer insulating film 103A (first silicon oxide film 103) better in the heat conducting property than the organic films is disposed between the first metal interconnect 102A and the second metal interconnect 112A, heat generated in the first metal interconnect 102A and the second metal interconnect 112A can be easily released.

Furthermore, according to Embodiment 1, the via holes 111 are formed in the first interlayer insulating film 103A by etching the second silicon oxide film 107 and the first interlayer insulating film 103A by using the hard mask 108A having the via openings 110. Therefore, the via holes 111 can be formed in a self-alignment manner. In this case, by setting the size of each via opening 110 formed in the second resist pattern 109 to be larger than the line width of the first metal interconnect 102A, the via holes 111 can be definitely formed on the first metal interconnects 102A even when the alignment shift is caused in the second resist pattern 109 and further in the hard mask 108A.

Embodiment 2

Now, a method of fabricating a semiconductor device according to Embodiment 2 of the invention will be described with reference to FIGS. 9(a) through 9(c), 10(a) through 10(c), 11(a) through 11(c), 12(a) through 12(c), 13(a) through 13(c), 14(a) through 14(c), 15(a) through 15(c), 16(a) through 16(c), 17(a) through 17(c), 18(a) through 18(c), 19(a) through 19(c) and 20(a) through 20(c).

Figure 9A:
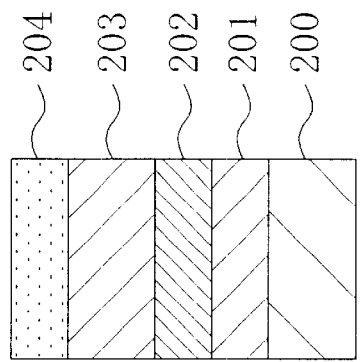
Figure 9B:
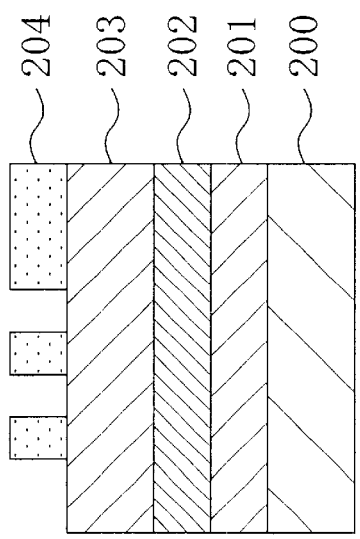
Figure 9C:
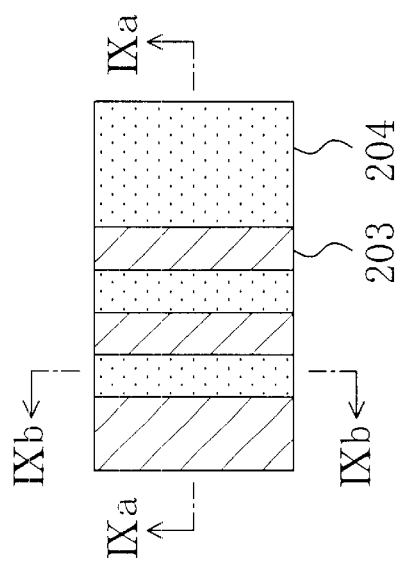

First, as is shown in FIGS. 9(a) through 9(c), an insulating film 201 having a thickness of 2.0 μm is deposited on the entire surface of a semiconductor substrate 200 bearing a semiconductor active device not shown. Then, a first metal film 202 with a thickness of 0.5 μm of a multi-layer film including a copper film and a tantalum alloy film such as a TaN film is deposited on the insulating film 201 by the sputtering or the electroplating. Thereafter, a first silicon oxide film 203 with a thickness of 1.0 μm is deposited on the first metal film 202, and a first resist pattern 204 having openings corresponding to interconnect forming areas of a first layer is formed on the first silicon oxide film 203.

Figure 10B:
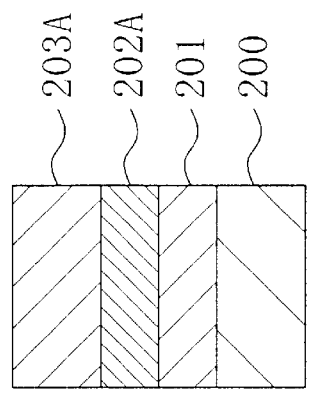
Figure 10A:
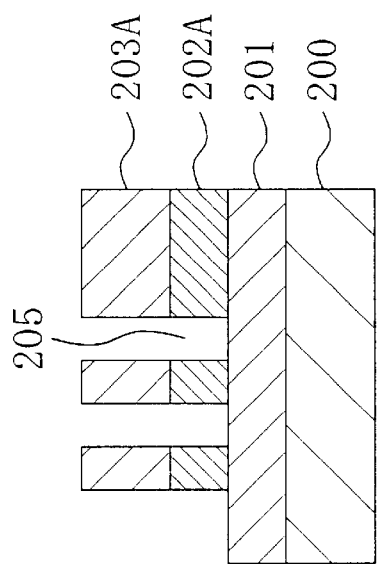
Figure 10C:
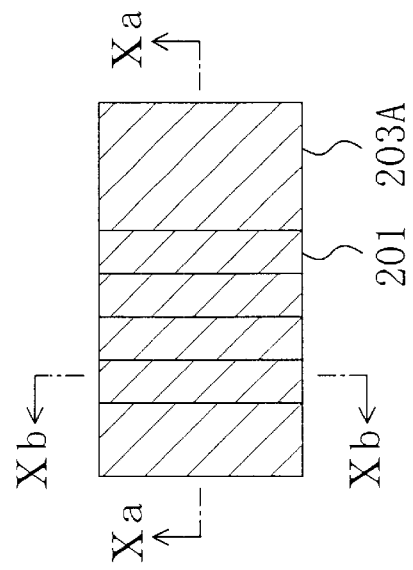

Next, as is shown in FIGS. 10(a) through 10(c), the first silicon oxide film 203 is etched by using a CF etching gas at a low temperature with the first resist pattern 204 used as a mask, thereby forming a first interlayer insulating film 203A. Then, the first metal film 202 is etched so as to expose the insulating film 201 by using a Cl etching gas at a high temperature, thereby forming first metal interconnects 202A having a first line spacing 205. Then, the first resist pattern 204 is removed.

Figure 11B:
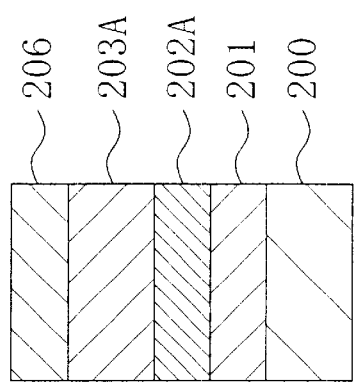
Figure 11A:
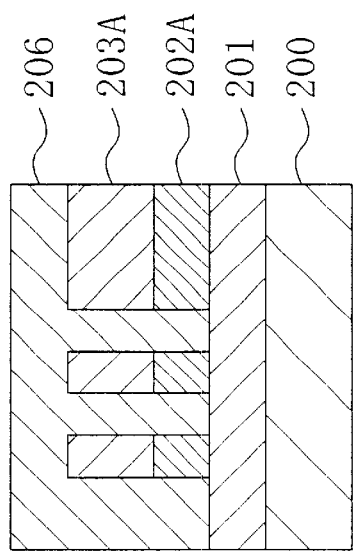
Figure 11C:
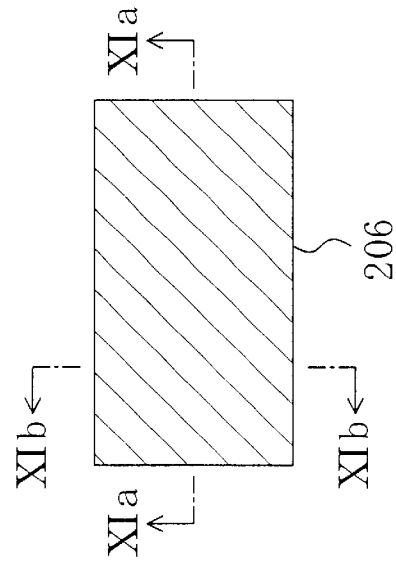

Subsequently, as is shown in FIGS. 11(a) through 11(c), a second interlayer insulating film 206 of an organic film is deposited on the entire surface of the semiconductor substrate 200 by the spin coater method or the plasma enhanced CVD, and a portion of the second interlayer insulating film 206 exposed on the first metal interconnects 202A is removed by the CMP. An example of the material for the organic film used for forming the second interlayer insulating film 206 is an organic substance including organic polysiloxane or fluorine. The organic film made from such a material is characterized by a smaller dielectric constant than the first silicon oxide film 203 (first interlayer insulating film 203A) and a lower etching rate against a CF etching gas than the first silicon oxide film 203. Since the second interlayer insulating film 206 has a small dielectric constant, the capacity between the first metal interconnects 202A can be reduced.

Figure 12B:
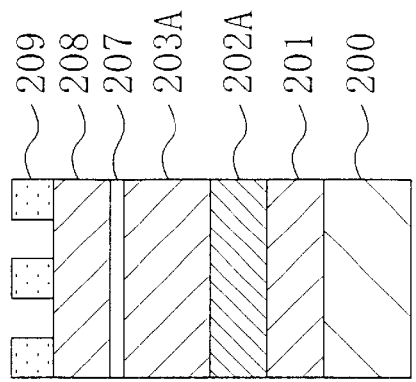
Figure 12A:
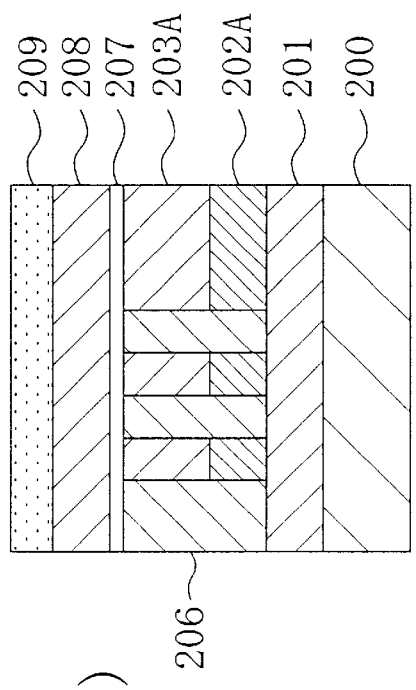
Figure 12C:
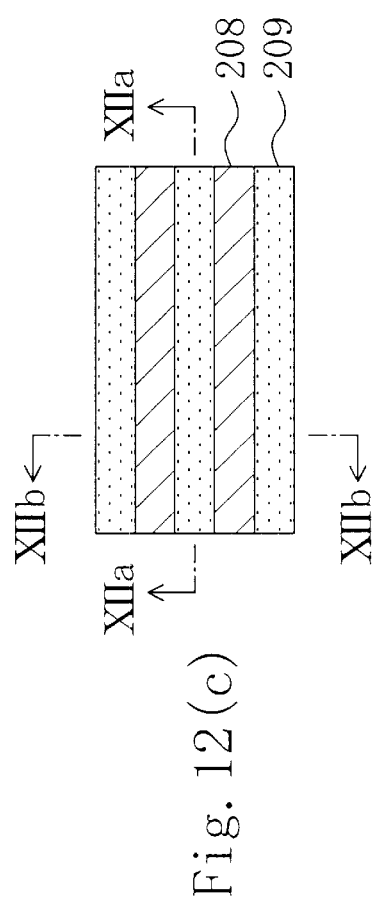

Next, as is shown in FIGS. 12(a) through 12(c), a first stopper film 207 of, for example, a silicon nitride film and a sacrifice film 208 of, for example, a silicon oxide film are successively deposited on the entire surface of the semiconductor substrate 200. Thereafter, a second resist pattern 209 having openings corresponding to line spacings of a second layer is formed on the sacrifice film 208.

Figure 13B:
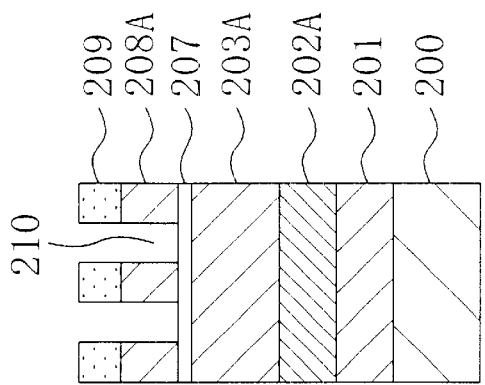
Figure 13A:
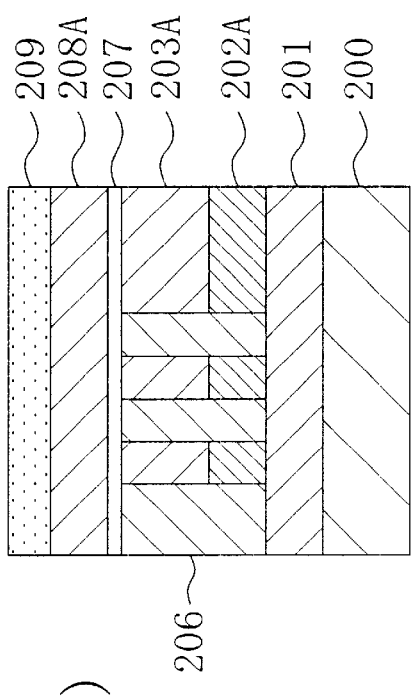
Figure 13C:
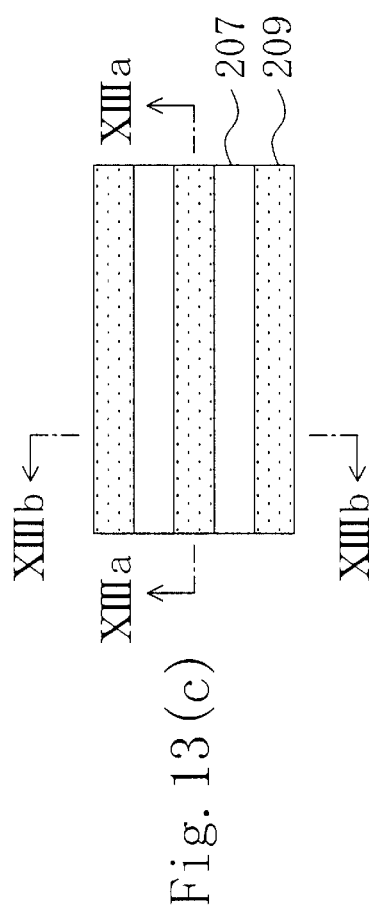

Then, as is shown in FIGS. 13(a) through 13(c), the sacrifice film 208 is etched by using the second resist pattern 209 as a mask and the first stopper film 207 as an etching stopper, thereby forming interconnect patterns 208A having a second line spacing 210. Thereafter, the second resist pattern 209 is removed. The interconnect patterns 208A are to be replaced with second metal interconnects in the future.

Figure 14B:
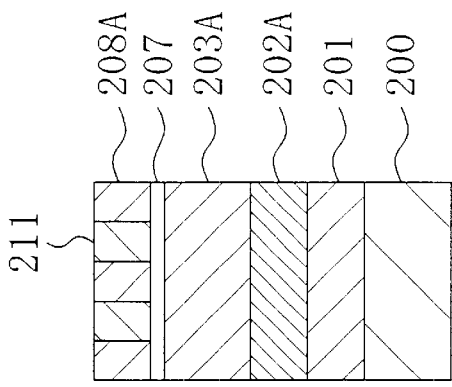
Figure 14A:
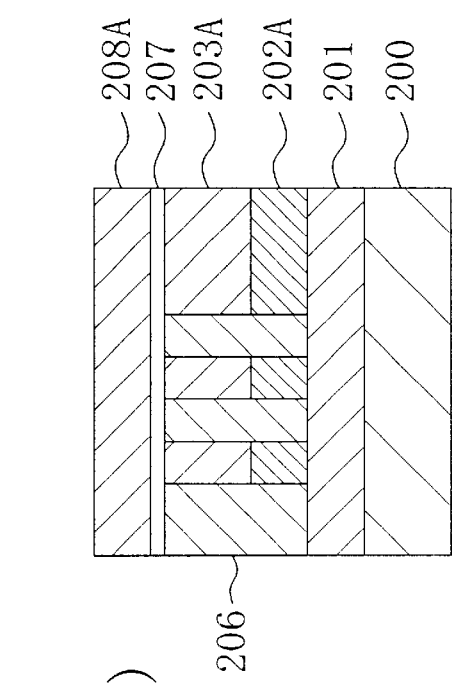
Figure 14C:
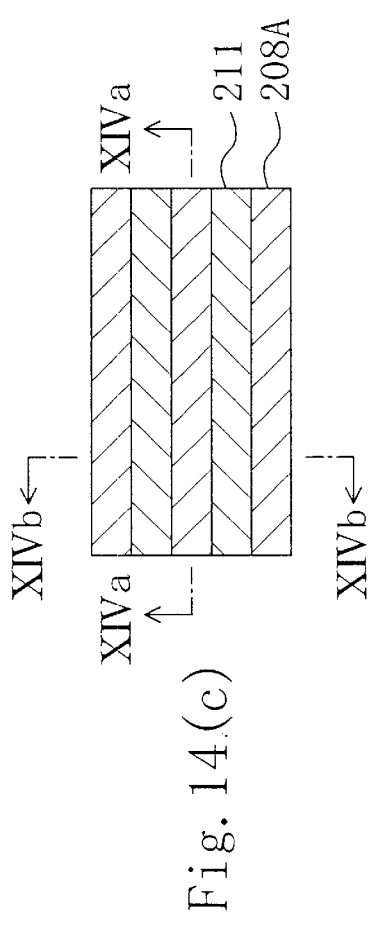

Subsequently, as is shown in FIGS. 14(a) through 14(c), a third interlayer insulating film 211 of an organic film is deposited on the entireisurface of the semiconductor substrate 200 by the spin coater method or the plasma enhanced CVD, and a portion of the third interlayer insulating film 211 exposed on the interconnect patterns 208A is removed by the CMP. Thus, the top surface of the third interlayer insulating film 211 is placed at the same level as the top surfaces of the interconnect patterns 208A. An example of the material used for forming the third interlayer insulating film 211 is an organic substance including organic polysiloxane or fluorine similarly to the second interlayer insulating film 206.

Figure 15B:
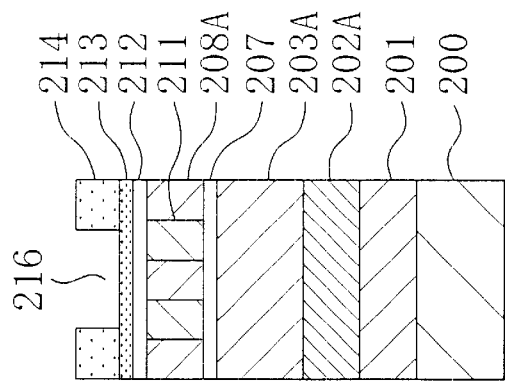
Figure 15A:
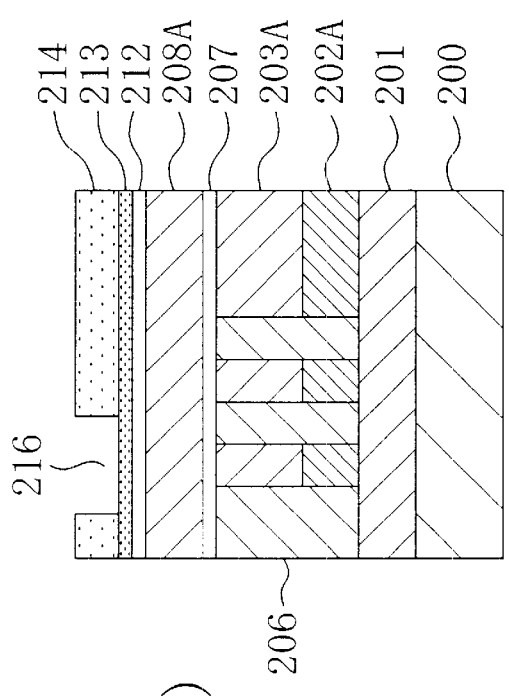
Figure 15C:
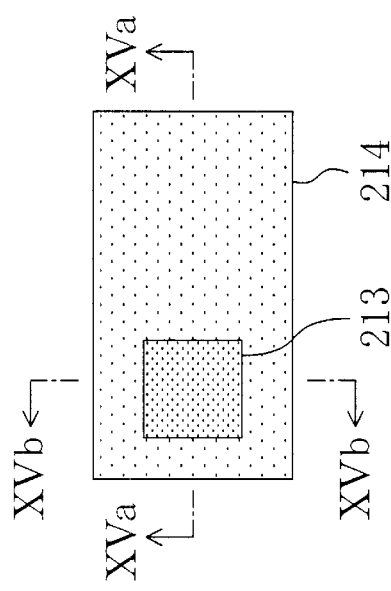

Next, as is shown in FIGS. 15(a) through 15(c), a second stopper film 212 of, for example, a silicon nitride film and a titanium nitride film 213 are successively deposited on the entire surface of the semiconductor substrate 200, and a third resist pattern 214 having via openings 216 is formed on the titanium nitride film 213.

Figure 16B:
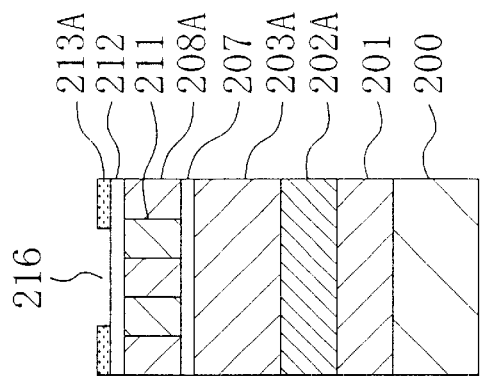
Figure 16A:
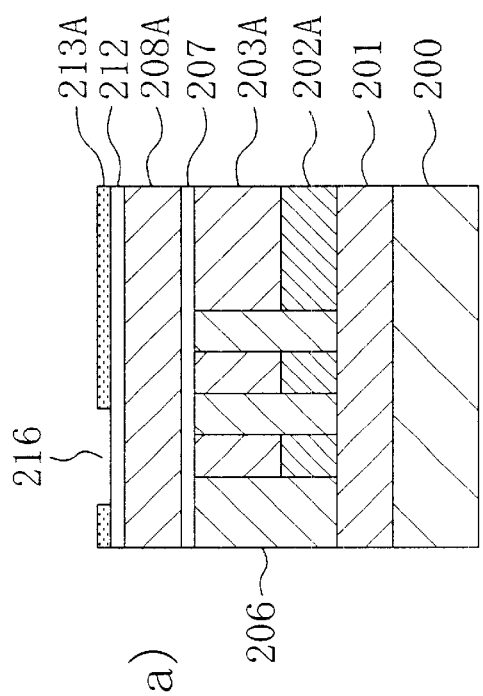
Figure 16C:
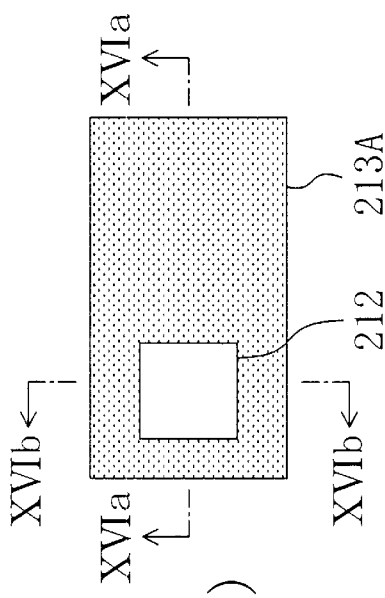

Then, as is shown in FIGS. 16(a) through 16(c), the titanium nitride film 213 is etched by using the third resist pattern 214 as a mask and the second stopper film 212 as an etching stopper, thereby forming a hard mask 213A onto which the via openings 216 have been transferred.

Figure 17B:
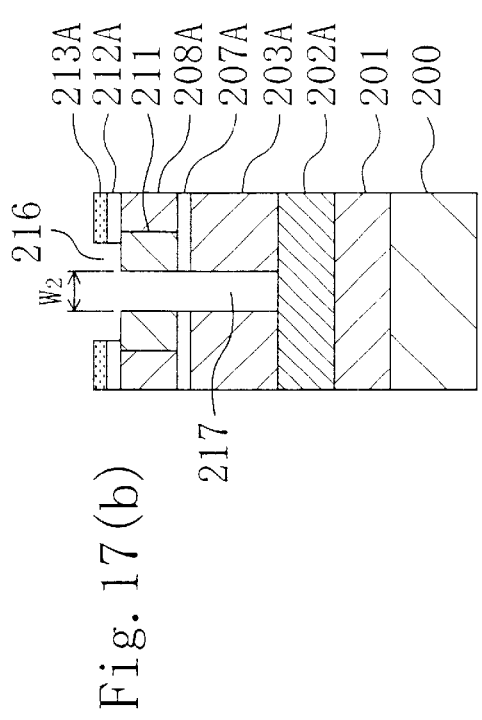
Figure 17A:
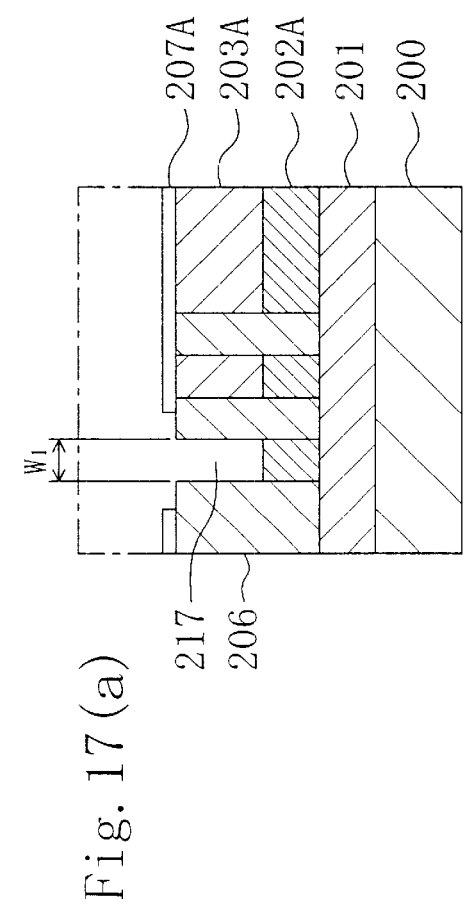
Figure 17C:
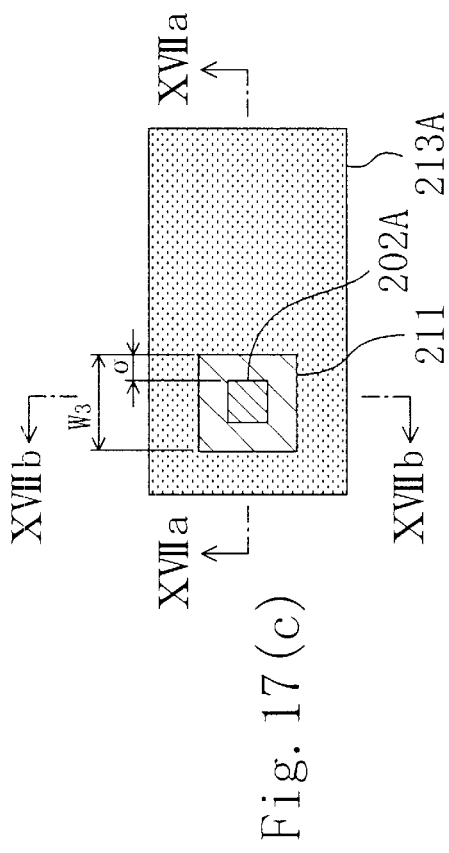

Thereafter, as is shown in FIGS. 17(a) through 17(c), the second stopper film 212, the interconnect patterns 208A, the first stopper film 207 and the first interlayer insulating film 203A are successively etched by a CF etching gas with the hard mask 213A used as a mask, thereby forming via holes 217 in the first interlayer insulating film 203A and the second interlayer insulating film 206. In this case, each via opening 216 of the third resist pattern 214 is set to have a dimension $W_3$ corresponding to the line width $W_1$ of the first metal interconnect 202A and the line width $W_2$ of a second metal interconnect 215A (see FIGS. 20(a) through 20(c)) both provided with clearances δ on both sides. Thus, the alignment shift caused in the lithography can be canceled. Furthermore, since the side faces exposed to the opening of the third interlayer insulating film 211 and the second interlayer insulating film 206 made from the organic films work as side etching stoppers in the etching, the via holes 217 each having a dimension of $W_1 \times W_2$ can be definitely formed on the first metal interconnects 202A in a self-alignment manner.

Figure 18B:
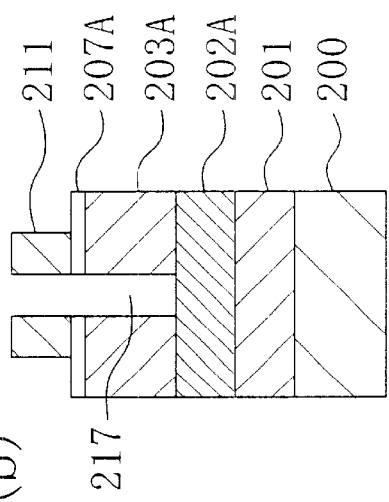
Figure 18A:
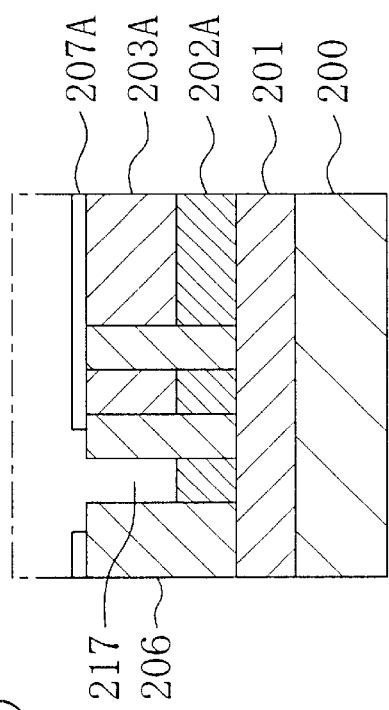
Figure 18C:
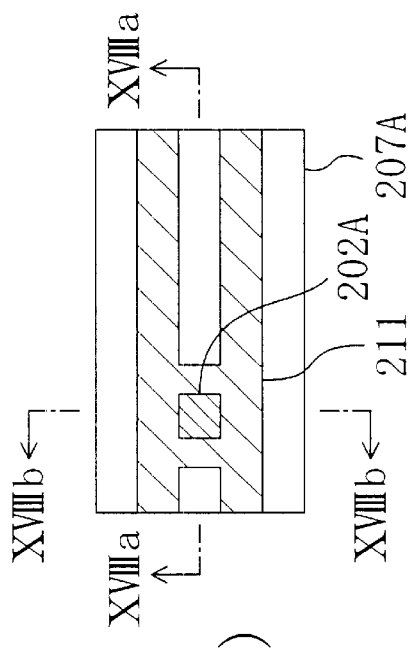

Next, as is shown in FIGS. 18(a) through 18(c), after removing the hard mask 213A by using an etching gas for a metal film, the interconnect patterns 208A are etched by using a patterned first stopper film 207A as an etching stopper, thereby removing the interconnect patterns 208A. In this case, since the third interlayer insulating film 211 is made from the organic film and hence has an etching resistance against the etching gas for a metal film, the shape of the third interlayer insulating film 211 can be satisfactorily kept.

Figure 19B:
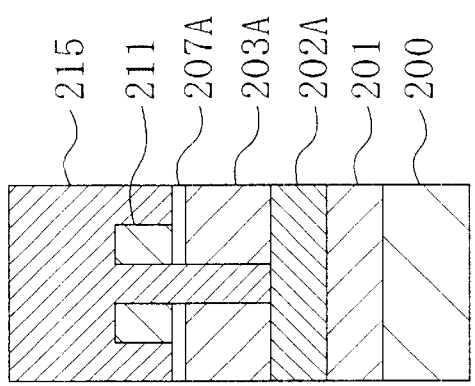
Figure 19A:
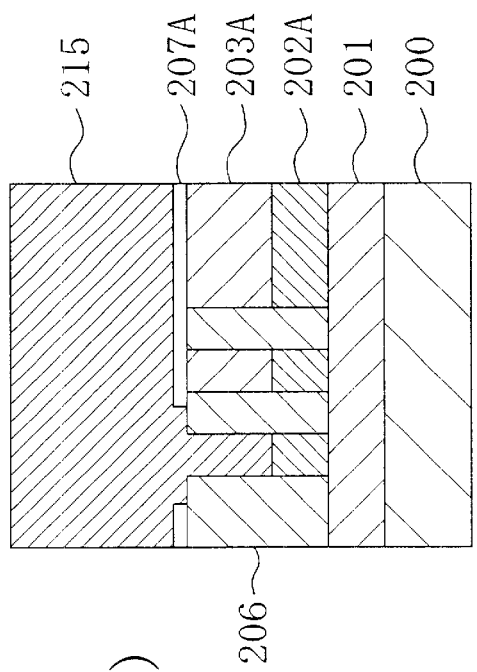
Figure 19C:
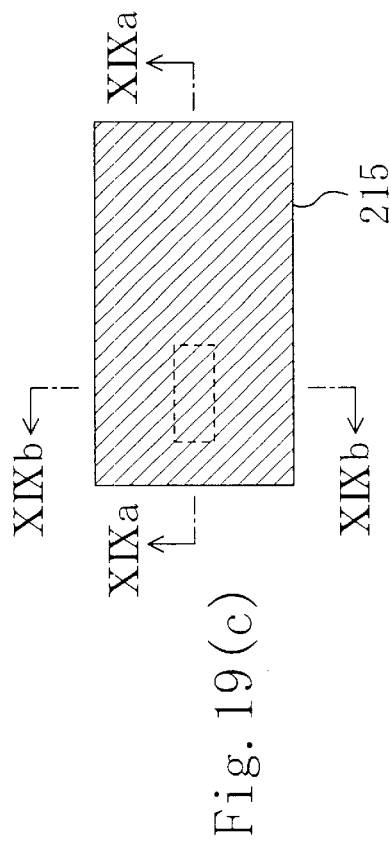

Then, although not shown in the drawings, an adhesion layer of a very thin TaN film and a seed layer of a copper film are formed on the entire surface of the semiconductor substrate 200 including the via holes 217. Thereafter, as is shown in FIGS. 19(a) through 19(c), a copper film 215 is deposited so as to fill the via holes 217 by the electroplating.

Figure 20B:
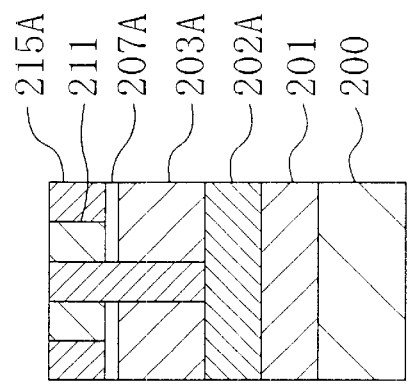
Figure 20A:
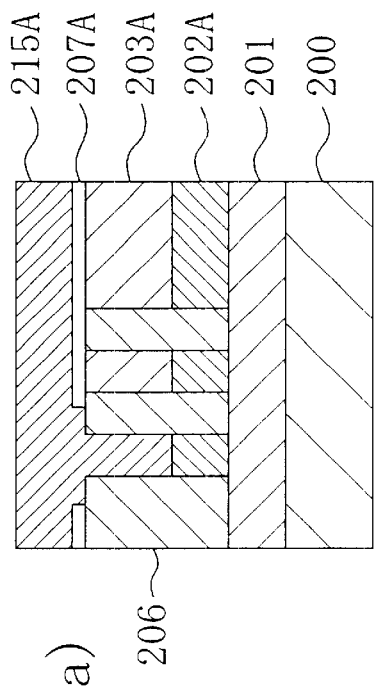
Figure 20C:
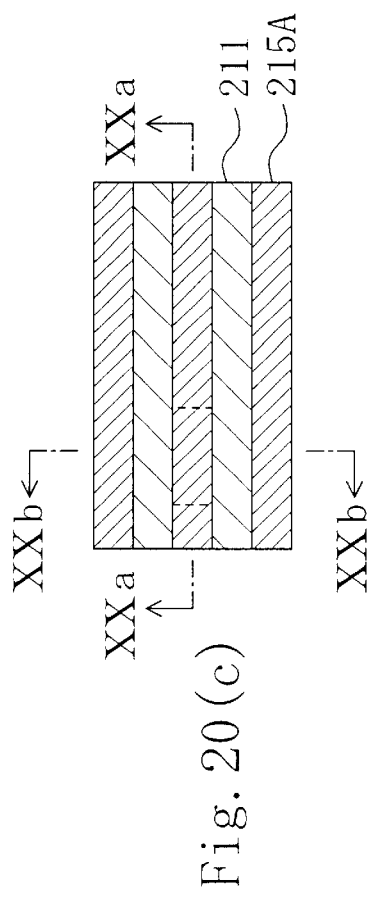

Next, as is shown in FIGS. 20(a) through 20(c), a portion of the copper film 215 exposed on the third interlayer insulating film 211 is removed by the CMP, resulting in obtaining the second metal interconnects 215A having a dual damascene structure.

According to Embodiment 2, the second interlayer insulating film 206 of the organic film having a small dielectric constant is disposed in the interval in the first metal interconnects 202A, and the third interlayer insulating film 211 of the organic film having a small dielectric constant is disposed in the interval in the second metal interconnects 215A. Therefore, the capacity between the first metal interconnects 202A and between the second metal interconnects 215A can be reduced. Furthermore, the first interlayer insulating film 203A (first silicon oxide film 203) better in the heat conducting property than the organic films is disposed between the first metal interconnect 202A and the second metal interconnect 215A. Therefore, heat generated in the first metal interconnect 202A and the second metal interconnect 215A can be easily released.

Furthermore, according to Embodiment 2, the via holes 217 are formed in the first interlayer insulating film 203A and the second interlayer insulating film 206 by successively etching the second stopper film 221, the interconnect patterns 208A, the first stopper film 207 and the first interlayer insulating film 203A by using the hard mask 213A having the via openings 216 as a mask. Therefore, the via holes 217 can be formed in a self-alignment manner. In this case, by setting the size of each via opening 216 formed in the third resist pattern 214 to be larger than the line width of the first metal interconnect 202A and the line width of the second metal interconnect 215A formed in the subsequent procedure, the via holes 217 can be definitely formed on the first metal interconnects 202A even when the alignment shift is caused in the third resist pattern 214.

Embodiment 3

Now, a method of fabricating a semiconductor device according to Embodiment 3 of the invention will be described with reference to FIGS. 21(a) through 21(c), 22(a) through 22(c), 23(a) through 23(c), 24(a) through 24(c), 25(a) through 25(c), 26(a) through 26(c), 27(a) through 27(c), 28(a) through 28(c), 29(a) through 29(c), 30(a) through 30(c), 31(a) through 31(c), 32(a) through 32(c) and 33(a) though 33(c).

Figure 21B:
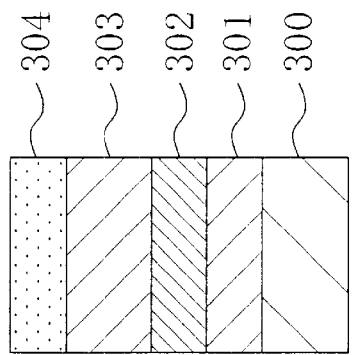
Figure 21A:
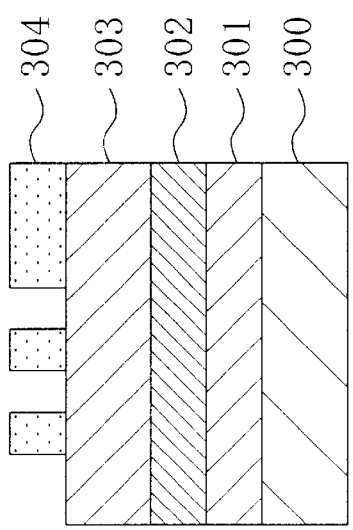
Figure 21C:
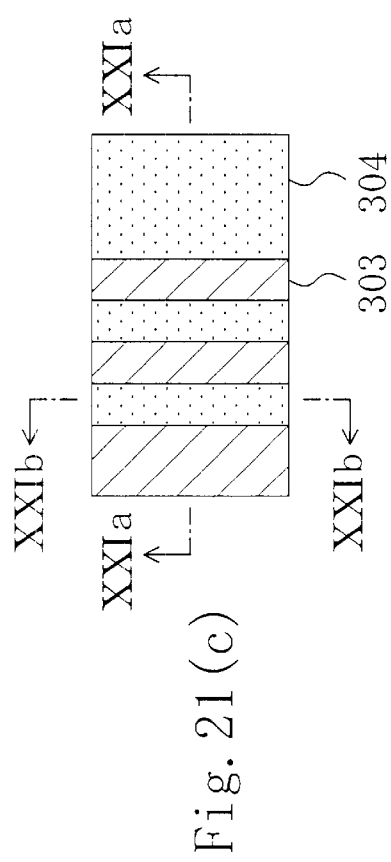

First, as is shown in FIGS. 21(a) through 21(c), an insulating film 301 having a thickness of 2.0 $\mu$m is formed on the entire surface of a semiconductor substrate 300 bearing a semiconductor active device not shown. Then, a first metal film 302 with a thickness of 0.5 $\mu$m of a multi-layer film including a copper film and a tantalum alloy film such as a TaN film is deposited on the insulating film 301 by the sputtering or the electroplating. Thereafter, a first silicon oxide film 303 with a thickness of 1.0 $\mu$m is deposited on the first metal film 302, and a first resist pattern 304 having openings corresponding to interconnect forming areas of a first layer is formed on the first silicon oxide film 303.

Figure 22B:
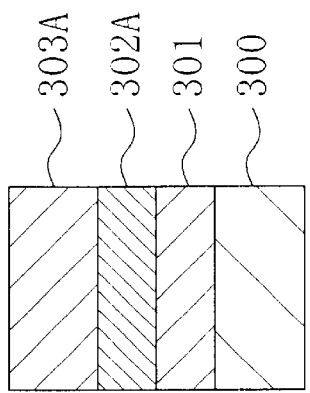
Figure 22A:
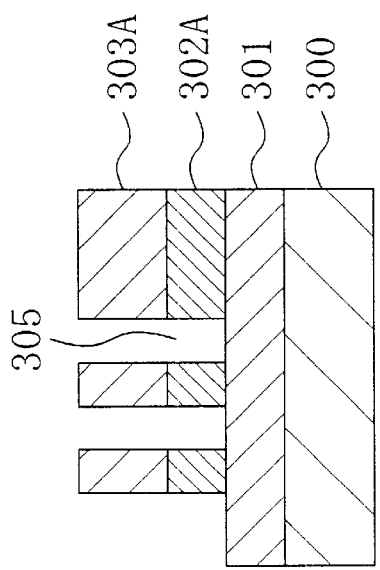
Figure 22C:
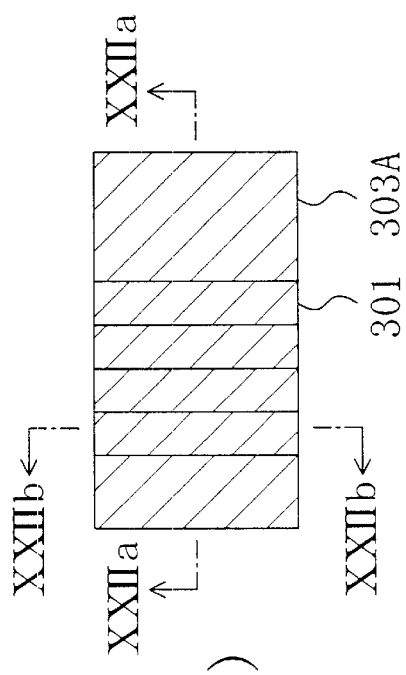

Next, the first silicon oxide film 303 is etched by using a CF etching gas at a low temperature with the first resist pattern 304 used as a mask, and the first metal film 302 is etched by using a Cl etching gas at a high temperature. Thus, as is shown in FIGS. 22(a) through 22(c), a first interlayer insulating film 303A is formed from the first silicon oxide film 303 and first metal interconnects 302A having a first line spacing 305 are formed. Then, the first resist pattern 304 is removed.

Figure 23:
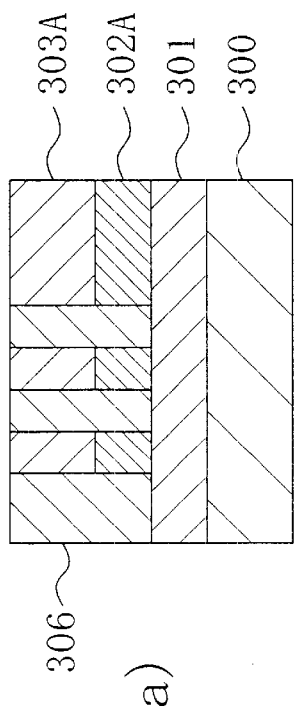
Figure 23:
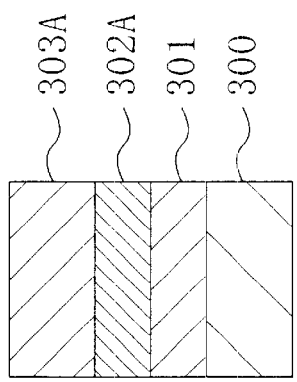
Figure 23:
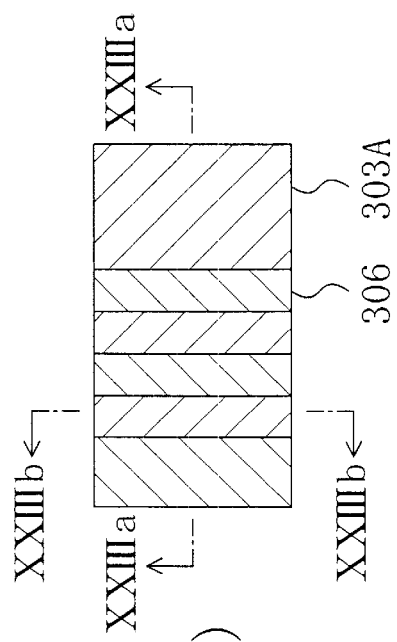

Thereafter, as is shown in FIGS. 23(a) through 23(c), a second interlayer insulating film 306 of an organic film is deposited on the entire surface of the semiconductor substrate 300 by the spin coater method or the plasma enhanced CVD, and a portion of the second interlayer insulating film 306 exposed on the first metal interconnects 302A is removed by the CMP. An example of the material for the organic film used for forming the second interlayer insulating film 306 is an organic substance including organic polysiloxane or fluorine. The organic film made from such a material is characterized by a smaller dielectric constant than the first silicon oxide film 303 (first interlayer insulating film 303A) and a lower etching rate against a CF etching gas than the first silicon oxide film 303. Since the second interlayer insulating film 306 has a small dielectric constant, the capacity between the first metal interconnects 302A can be reduced.

Figure 24B:
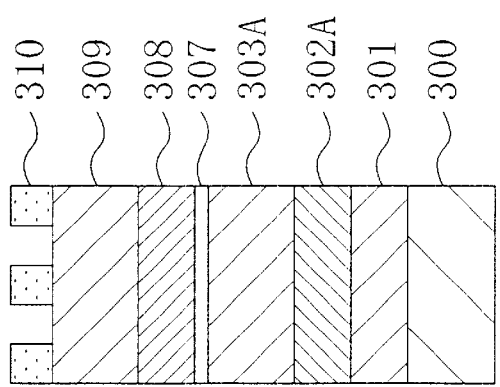
Figure 24A:
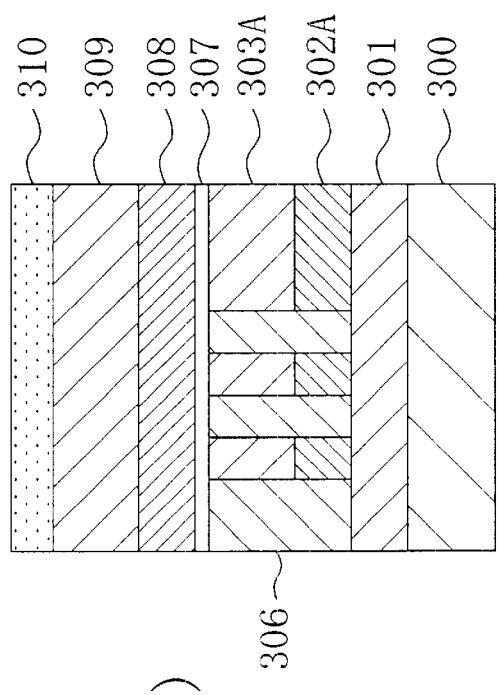
Figure 24C:
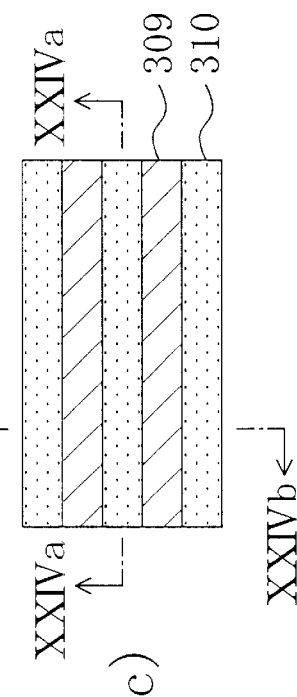

Next, as is shown in FIGS. 24(a) through 24(c), a first stopper film 307 of a silicon nitride film, a second metal film 308 with a thickness of 0.5 $\mu$m of a multi-layer film including a copper film and a tantalum alloy film such as a TaN film, and a second silicon oxide film 309 with a thickness of 1.0 $\mu$m are successively deposited on the entire surface of the semiconductor substrate 300. Thereafter, a second resist pattern 310 having openings corresponding to interconnect forming areas of a second layer is formed on the second silicon oxide film 309.

Figure 25B:
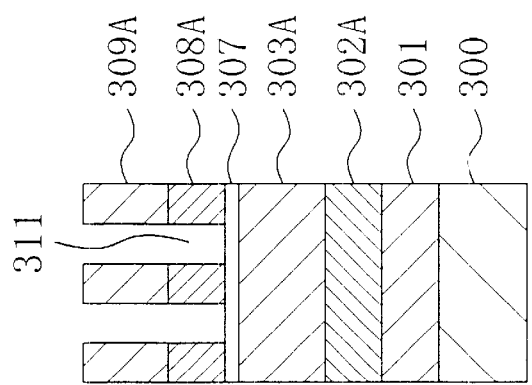
Figure 25A:
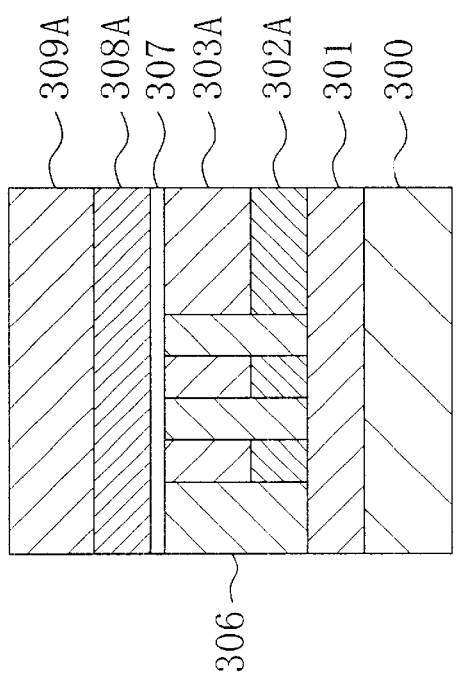
Figure 25C:
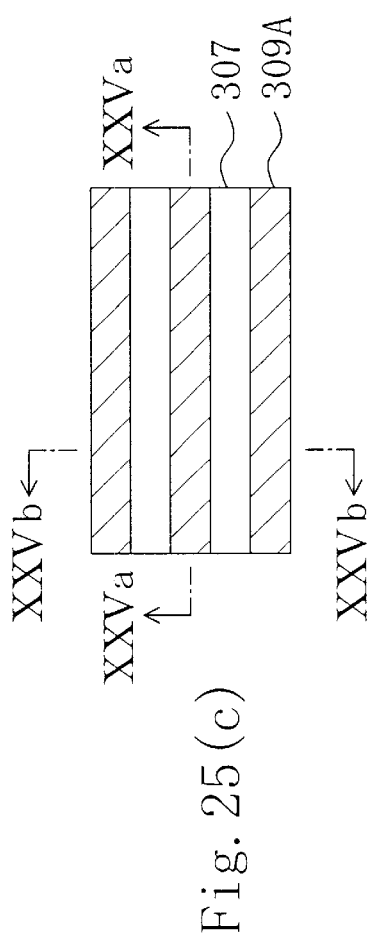

Then, as is shown in FIGS. 25(a) through 25(c), the second silicon oxide film 309 is etched by using the second resist pattern 310 as a mask, thereby forming a third interlayer insulating film 309A. Subsequently, the second metal film 308 is etched by using the first stopper film 307 as an etching stopper, thereby forming second metal interconnects 308A having a second line spacing 311. Then, the second resist pattern 310 is removed.

Figure 26:
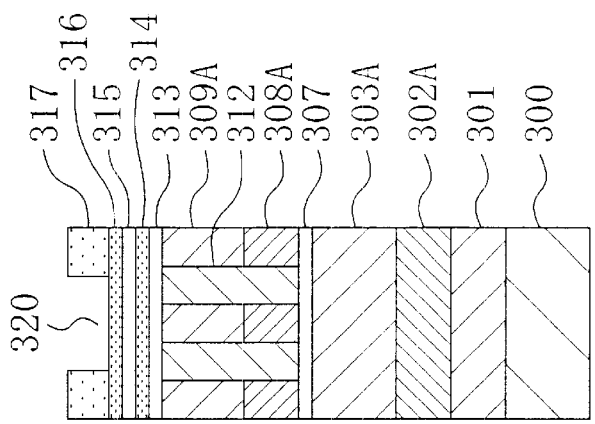
Figure 26:
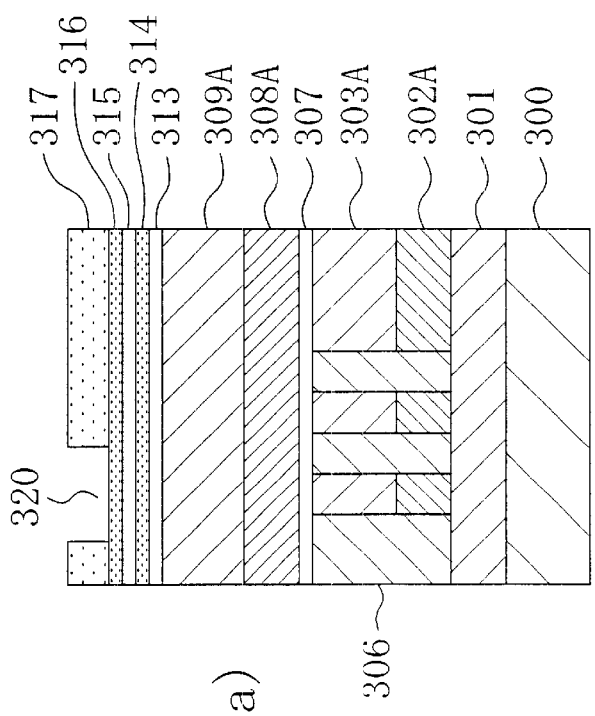
Figure 26:
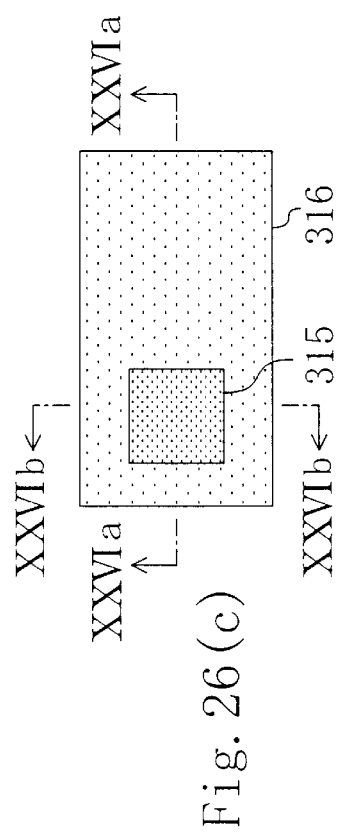

Subsequently, as is shown in FIGS. 26(a) through 26(c), a fourth interlayer insulating film 312 of an organic film is deposited on the entire surface of the semiconductor substrate 300 by the spin coater method or the plasma enhanced CVD, and a portion of the fourth interlayer insulating film 312 exposed on the third interlayer insulating film 309A is removed by the CMP. Thus, the top surface of the fourth interlayer insulating film 312 is placed at the same level as the top surface of the third interlayer insulating film 309A. An example of the material for the organic film used for forming the fourth interlayer insulating film 312 is an organic substance including organic polysiloxane or fluorine. Thereafter, a second stopper film 313 of a silicon nitride film, a first titanium nitride film 314, a third stopper film 315 of a silicon nitride film and a second titanium nitride film 316 are successively deposited on the third interlayer insulating film 309A and the fourth interlayer insulating film 312. Then, a third resist pattern 317 having via openings 320 is formed on the second titanium nitride film 316.

Figure 27:
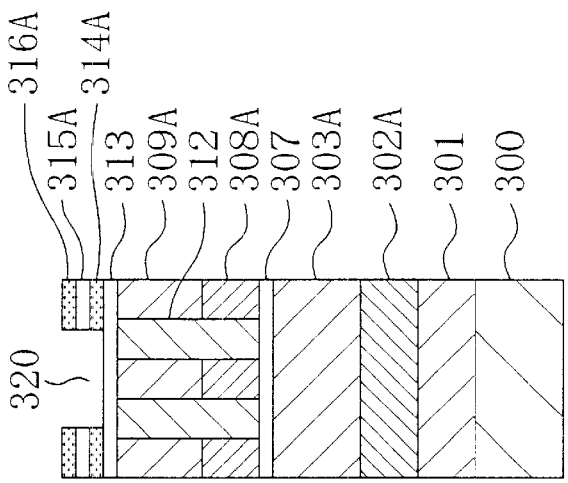
Figure 27:
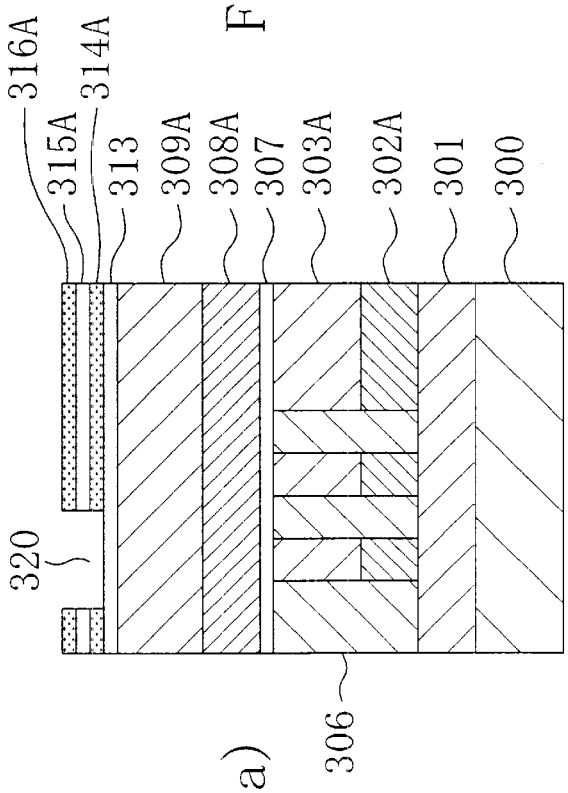
Figure 27:
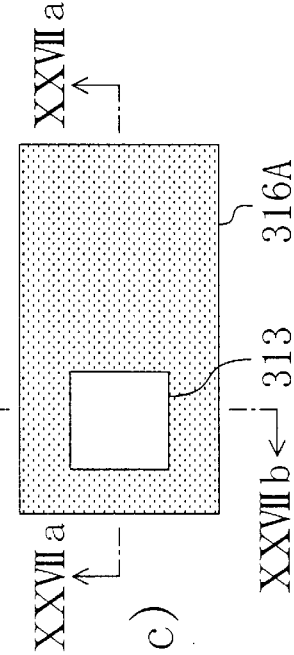

Next, as is shown in FIGS. 27(a) through 27(c), the second titanium nitride film 316, the third stopper film 315 and the first titanium nitride film 314 are successively etched by using the third resist pattern 317 as a mask and the second stopper film 313 as an etching stopper. Thus, a second hard mask 316A, a patterned third stopper film 315A and a first hard mask 314A are formed, and the third resist pattern 317 is then removed.

Then, as is shown in FIGS. 28(a) through 28(c), the second stopper film 313 and the third interlayer insulating film 309A are etched by using an etching gas for a silicon oxide film with the second hard mask 316A used as a mask, thereby forming a patterned second stopper film 313A and transferring the via openings 320 onto the third interlayer insulating film 309A. This etching is completed when the top surfaces of the second metal interconnects 308A are exposed. Also, since the fourth interlayer insulating film 312 is made from the organic film and hence is minimally etched by the etching gas for a silicon oxide film, the shape of the fourth interlayer insulating film 312 can be satisfactorily kept.

Figure 29:
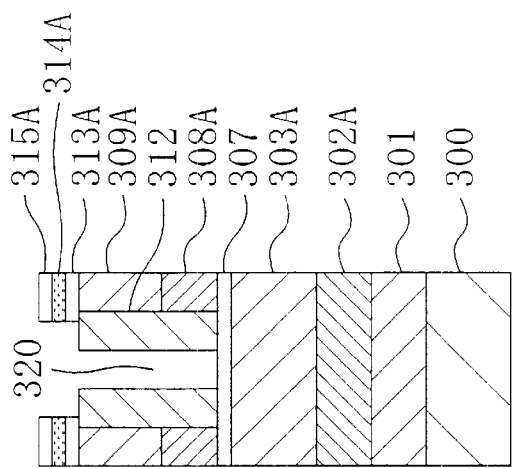
Figure 29:
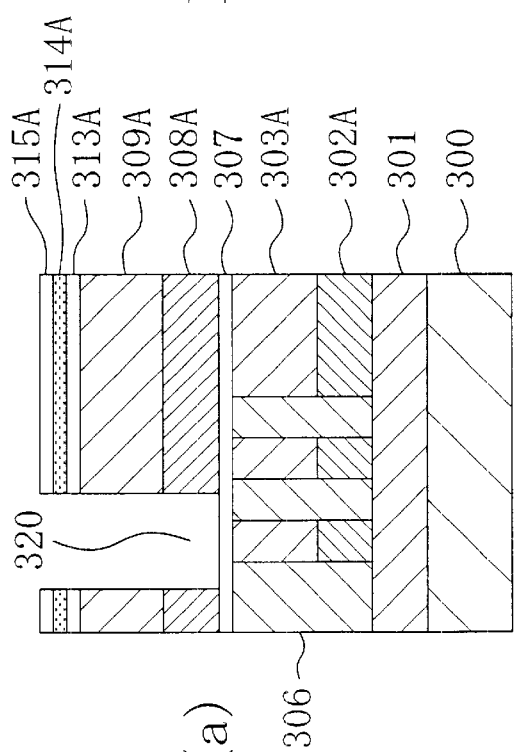
Figure 29:
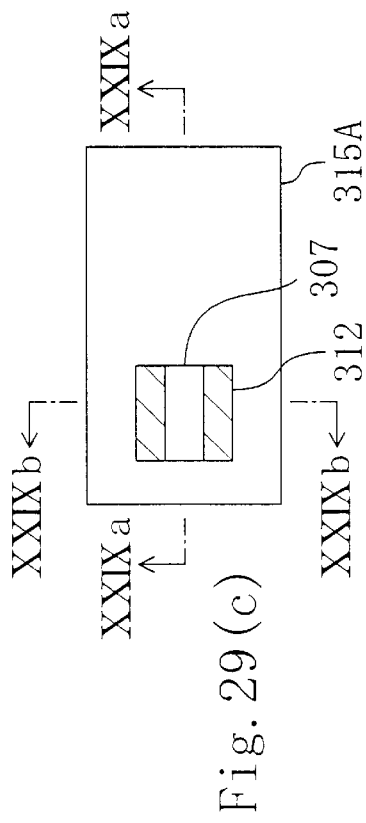

Subsequently, as is shown in FIGS. 29(a) through 29(c), the second metal interconnects 308A are etched by using an etching gas for a metal film with the patterned third stopper film 315A used as a mask, thereby transferring the via openings 320 onto the second metal interconnects 308A.

During this etching, the second hard mask 316A remaining on the patterned third stopper film 315A is removed.

Next, as is shown in FIGS. 30(a) through 30(c), the first stopper film 307 and the first interlayer insulating film 303A are etched by using an etching gas for a silicon oxide film with the first hard mask 314A as a mask, thereby forming a patterned first stopper film 307A and forming via holes 321 in the first interlayer insulating film 303A. This etching is completed when the top surfaces of the first metal interconnects 302A are exposed. Also, since the second interlayer insulating film 306 is made from the organic film and hence is minimally etched by the etching gas for a silicon oxide film, the shape of the second interlayer insulating film 306 can be satisfactorily kept. During this etching, the patterned first stopper film 315A remaining on the first hard mask 314A is removed. In this case, each via opening 320 of the third resist pattern 317 is set to have a dimension $W_3$ corresponding to the line width $W_1$ of the first metal interconnect 302A and the line width $W_2$ of the second metal interconnect 308A both provided with clearances δ on both sides. Thus, the alignment shift caused in the lithography can be canceled. Furthermore, the side faces exposed to the opening of the fourth interlayer insulating film 312 and the second interlayer insulating film 306 made from the organic films work as side etching stoppers in the etching, and hence, the via holes 321 each having a dimension of $W_1 \times W_2$ can be definitely formed on the first metal interconnects 302A in a self-alignment manner.

Figure 31B:
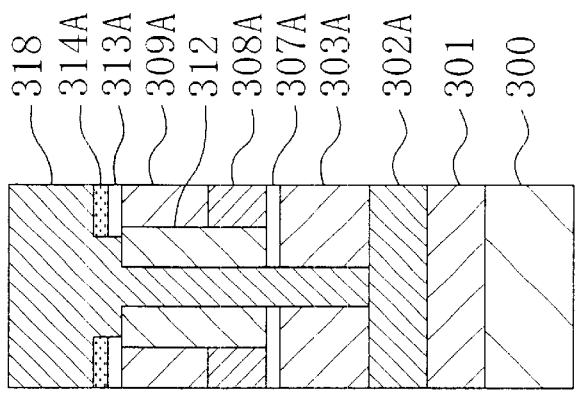
Figure 31A:
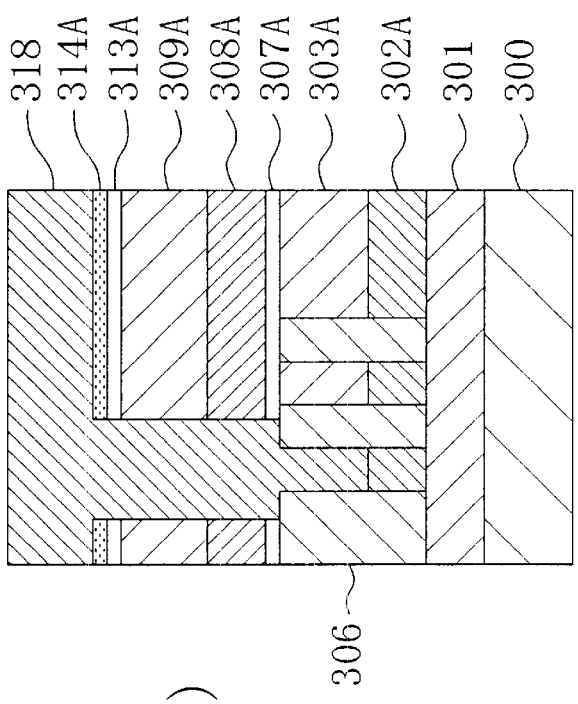
Figure 31C:
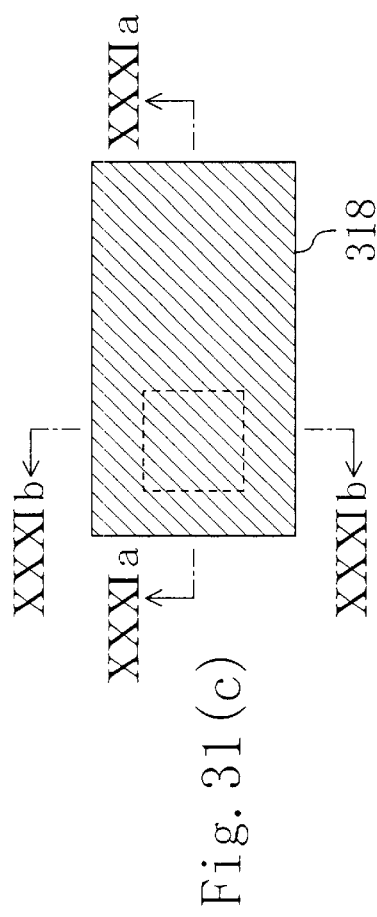

Thereafter, although not shown in the drawings, an adhesion layer of a very thin TaN film and a seed layer of a copper film are formed on the entire surface of the semiconductor substrate 300 including the via holes 321. Then, as is shown in FIGS. 31(a) through 31(c), a copper film 318 is deposited so as to fill the via holes 321 by the electroplating. Thus, the first metal interconnects 302A and the second metal interconnects 308A are connected through the copper film 318, and the second metal interconnects 308A are mutually connected through the copper film 318. Instead of depositing the copper film 318 by the electroplating, a tungsten film can be deposited by a blanket method with a TiN material used as an underlying film.

Figure 32B:
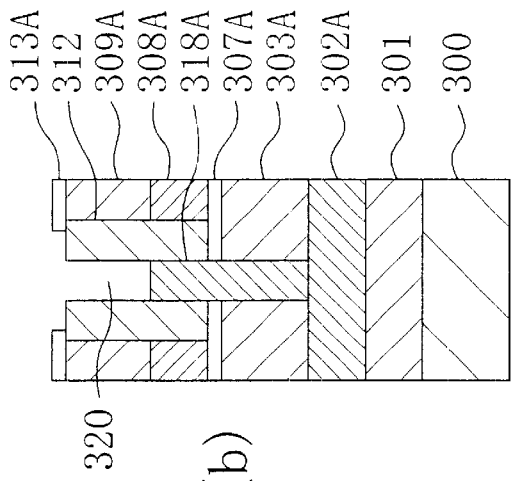
Figure 32A:
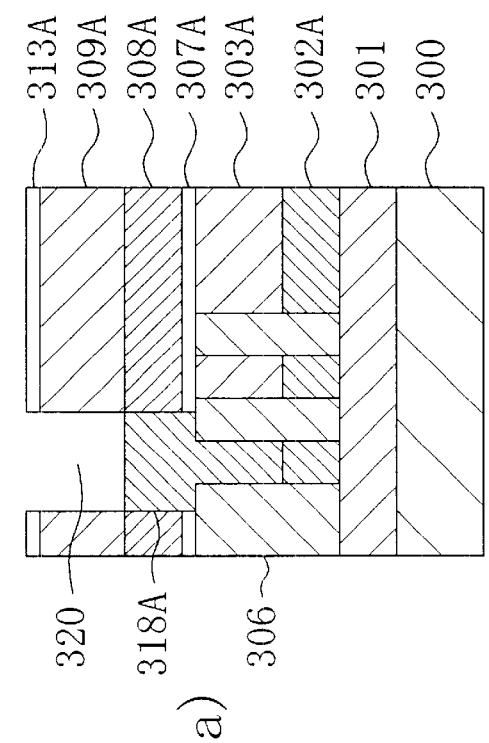
Figure 32C:
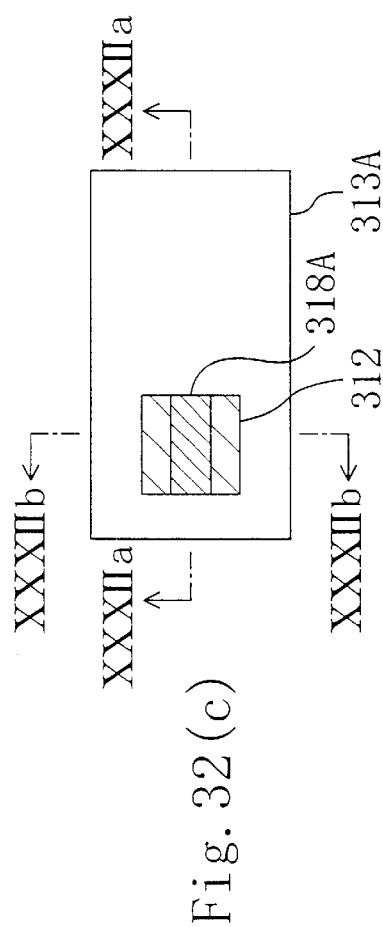

Then, as is shown in FIGS. 32(a) through 32(c), the copper film 318 and the first hard mask 314A are etched by using an etching gas for a metal film until the top surface of the copper film 318 is placed at the same level as the top surfaces of the second metal interconnects 308A. Thus, via contacts 318A are formed from the copper film 318.

Figure 33B:
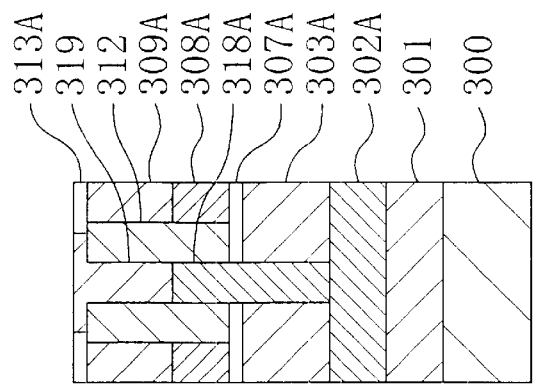
Figure 33A:
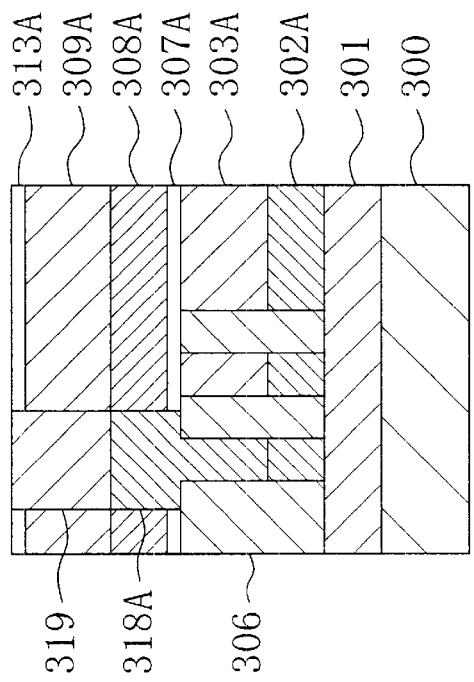
Figure 33C:
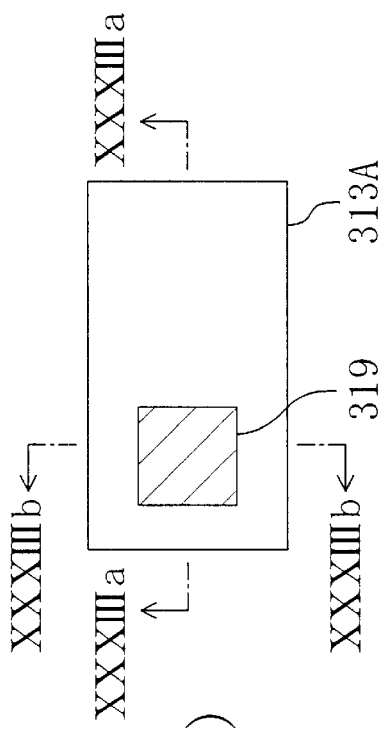
Figure 34A:
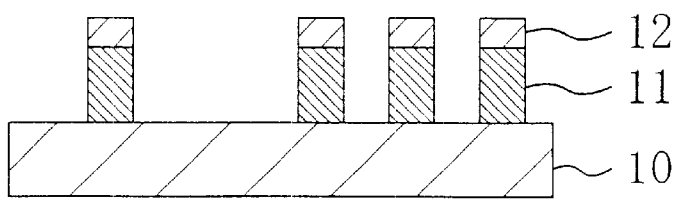
FIGS. 34(a) through 34(e) are sectional views for showing procedures in a conventional method of fabricating a semiconductor device.
Figure 34B:
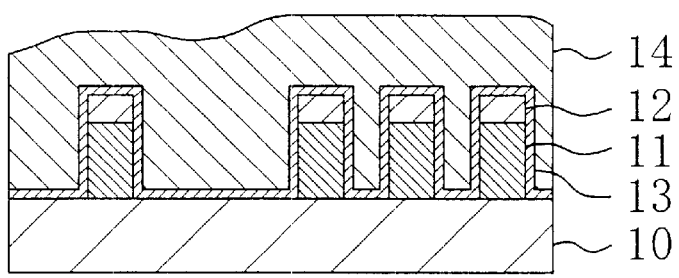
Figure 34C:
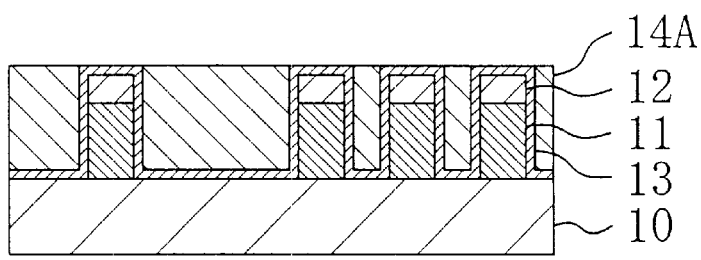
Figure 34D:
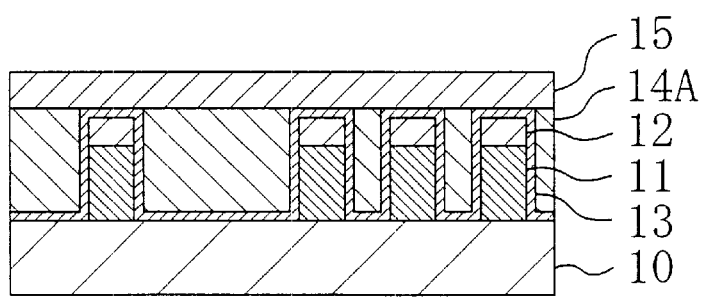
Figure 34E:
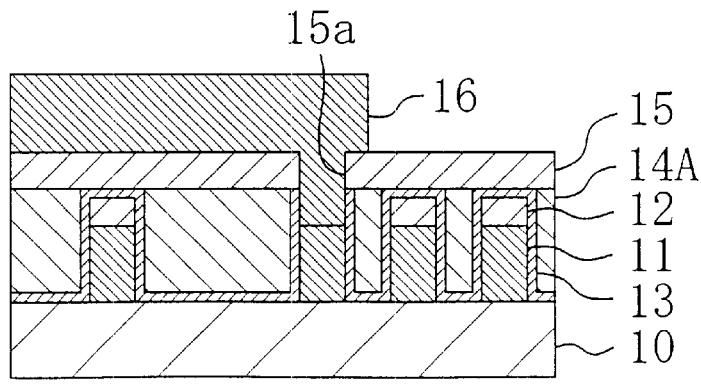
Figure 35:
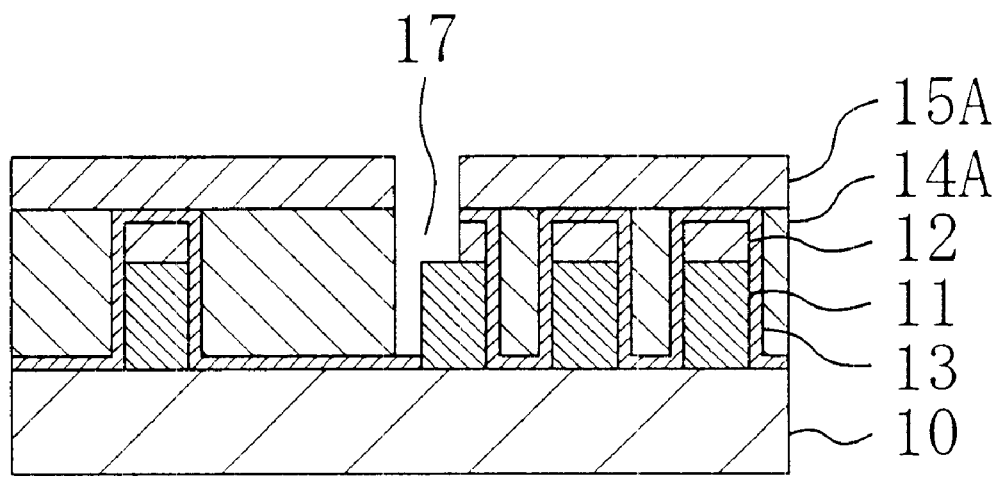
FIG. 35 is a diagram for explaining problems caused in the conventional method of fabricating a semiconductor device.

Next, as is shown in FIGS. 33(a) through 33(c), a burying insulating film 319 is deposited on the entire surface of the semiconductor substrate 300, and a portion of the burying insulating film 319 exposed on the patterned second stopper film 313A is removed by the CMP, thereby flattening the burying insulating film 319.

The aforementioned procedures are repeated so as to fabricate a semiconductor device having a multilayer interconnect structure including three or more interconnect layers.

According to Embodiment 3, the second interlayer insulating film 306 of the organic film having a small dielectric constant is disposed in the interval in the first metal interconnects 302A and the fourth interlayer insulating film 312 of the organic film having a small dielectric constant is disposed in the interval in the second metal interconnects 308A. Therefore, the capacity between the first metal interconnects 302A and between the second metal interconnects 308A can be reduced. Furthermore, the first interlayer insulating film 303A (first silicon oxide film 303) better in the heat conducting property than the organic films is disposed between the first metal interconnect 302A and the second metal interconnect 308A. Therefore, heat generated in the first metal interconnect 302A and the second metal interconnect 308A can be easily released.

Furthermore, according to Embodiment 3, the via holes 321 are formed in the first interlayer insulating film 303A by etching the first interlayer insulating film 303A with the first hard mask 314A having the via openings 320 used as a mask. Therefore, the via holes 321 can be formed in a self-alignment manner. In this case, by setting the size of each via opening 320 formed in the third resist pattern 317 to be larger than the line width of the first metal interconnect 302A and the line width of the second metal interconnect 308A formed in the subsequent procedure, the via holes 321 can be definitely formed on the first metal interconnects 302A even when the alignment shift is caused in the third resist pattern 317 and further in the first hard mask 314A and the second hard mask 316A.

What is claimed is:

1. A method of fabricating a semiconductor device comprising the steps of:

successively depositing a first metal film and a first interlayer insulating film on an insulating film formed on a semiconductor substrate;

forming a first mask pattern for masking first metal interconnect forming areas on said first interlayer insulating film, and etching said first interlayer insulating film and said first metal film by using said first mask pattern, whereby forming openings in said first interlayer insulating film and forming first metal interconnects from said first metal film;

filling a second interlayer insulating film made from a different material from said first interlayer insulating film in an interval in said first metal interconnects and in said openings of said first interlayer insulating film;

successively depositing a second metal film and a third interlayer insulating film on said first interlayer insulating film and said second interlayer insulating film;

forming a second mask pattern for masking second metal interconnect forming areas on said third interlayer insulating film, and etching said third interlayer insulating film and said second metal film by using said second mask pattern, whereby forming openings in said third interlayer insulating film and forming second metal interconnects from said second metal film;

filling a fourth interlayer insulating film in an interval in said second metal interconnects and in said openings of said third interlayer insulating film;

forming a third mask pattern having via openings corresponding to via hole forming areas on said third interlayer insulating film and said fourth interlayer insulating film;

etching said third interlayer insulating film by using said third mask pattern under etching conditions that an etching rate for said third interlayer insulating film is higher than an etching rate for said fourth interlayer insulating film, whereby forming via openings in said fourth interlayer insulating film;

etching said second metal interconnects by using said third mask pattern, whereby forming via openings in said second metal interconnects;

etching said first interlayer insulating film by using said third mask pattern under etching conditions that an etching rate for said first interlayer insulating film is higher than an etching rate for said second interlayer insulating film, whereby forming via holes for exposing said first metal interconnects in said second interlayer insulating film;

filling a third metal film in said via holes of said second interlayer insulating film and in said via openings of said second metal interconnect, whereby forming via contacts from said third metal film and connecting said via contacts to said second metal interconnects through said third metal film; and filling a burying insulating film in said via openings of said fourth interlayer insulating film.

2. The method of fabricating a semiconductor device of claim 1, wherein said first interlayer insulating film is made from a material including an inorganic component as a main component, and each of said second interlayer insulating film and said fourth interlayer insulating film is made from a material including an organic component as a main component.

3. The method of fabricating a semiconductor device of claim 1, wherein said second interlayer insulating film and said fourth interlayer insulating film have smaller dielectric constants than said first interlayer insulating film.

4. The method of fabricating a semiconductor device of claim 1, wherein said third mask pattern is a hard mask made from a metal material.

5. The method of fabricating a semiconductor device of claim 1, wherein each of said via openings is in a larger plan shape than each of said via holes.

* * * * *